US008929079B2

(12) United States Patent
Watanabe et al.

(10) Patent No.: US 8,929,079 B2
(45) Date of Patent: Jan. 6, 2015

(54) ELECTRONIC CONTROL DEVICE

(75) Inventors: Hirofumi Watanabe, Isesaki (JP);
Kazuhiko Nakano, Isesaki (JP);
Daisuke Yasukawa, Hitachinaka (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 193 days.

(21) Appl. No.: 13/606,353

(22) Filed: Sep. 7, 2012

(65) Prior Publication Data

US 2013/0058044 A1    Mar. 7, 2013

(30) Foreign Application Priority Data

Sep. 7, 2011  (JP) ................................. 2011-194588
Jul. 12, 2012  (JP) ................................. 2012-156599

(51) Int. Cl.
H05K 7/20      (2006.01)
H05K 5/00      (2006.01)
B62D 5/04      (2006.01)

(52) U.S. Cl.
CPC ............ *H05K 7/20854* (2013.01); *H05K 5/006* (2013.01)
USPC ...... 361/714; 361/679.54; 361/704; 361/705; 361/715; 361/719; 165/80.2; 165/80.3; 165/104.33; 180/444

(58) Field of Classification Search
USPC ............... 361/679.46, 679.54, 704–712, 714, 361/715–724, 732, 740, 748, 762–767; 165/80.2, 80.3, 104.33, 185; 257/686, 257/688, 696, 706–727; 174/15.1, 16.3, 174/17 R, 17.06, 17.08, 250–267; 318/139, 318/245, 254, 280; 312/223.2; 307/147; 363/143, 144; 303/116.4, 119.2, 119.3, 303/113.1, 115.2, 115.1; 310/68 D, 68 R, 71
See application file for complete search history.

(56) References Cited

U.S. PATENT DOCUMENTS

| 5,777,844 | A | * | 7/1998 | Kiefer | 361/704 |
| 6,078,155 | A | * | 6/2000 | Tominaga et al. | 318/293 |
| 6,099,325 | A | * | 8/2000 | Parkhill | 439/76.1 |
| 6,185,100 | B1 | * | 2/2001 | Bentz et al. | 361/704 |
| 6,377,462 | B1 | * | 4/2002 | Hajicek et al. | 361/719 |
| 6,434,006 | B1 | * | 8/2002 | Fukatsu et al. | 361/704 |
| 6,501,662 | B2 | * | 12/2002 | Ikeda | 361/760 |
| 6,757,155 | B2 | * | 6/2004 | Koike et al. | 361/600 |
| 6,785,146 | B2 | * | 8/2004 | Koike et al. | 361/759 |
| 6,788,539 | B2 | * | 9/2004 | Skofljanec | 361/719 |

(Continued)

FOREIGN PATENT DOCUMENTS

| JP | 2009-106073 | 5/2009 |
| JP | 2009-224708 | 10/2009 |
| JP | 2010-057345 | 3/2010 |
| JP | 2010-063242 | 3/2010 |

*Primary Examiner* — Michail V Datskovskiy
(74) *Attorney, Agent, or Firm* — Antonelli, Terry, Stout & Kraus, LLP.

(57) ABSTRACT

An electronic control device comprises a circuit board having a heat generating part mounted thereon; a case for installing therein the circuit board, the case having a heat receiving portion that is in contact with the heat generating part; at least two first fixing units that are constructed and arranged to fix a peripheral portion of the circuit board to the case; and at least one second fixing unit that is arranged to fix a given area of the circuit board to the case while pressing the given area against the heat receiving portion through the heat generating part, the given area being an area where the heat generating part is placed.

13 Claims, 20 Drawing Sheets

(56) References Cited

U.S. PATENT DOCUMENTS

| | | | |
|---|---|---|---|
| 6,881,077 B2 * | 4/2005 | Throum | 439/76.1 |
| 6,972,959 B2 * | 12/2005 | Asai et al. | 361/719 |
| 7,021,418 B2 * | 4/2006 | Tominaga et al. | 180/444 |
| 7,031,165 B2 * | 4/2006 | Itabashi et al. | 361/719 |
| 7,417,861 B2 * | 8/2008 | Kikuchi et al. | 361/718 |
| 7,621,367 B2 * | 11/2009 | Tominaga et al. | 180/444 |
| 7,697,300 B2 * | 4/2010 | Brandt et al. | 361/736 |
| 7,755,907 B2 * | 7/2010 | Inagaki | 361/752 |
| 7,899,602 B2 * | 3/2011 | Yoshinari et al. | 701/104 |
| 7,916,491 B2 * | 3/2011 | Fino et al. | 361/752 |
| 7,989,997 B2 | 8/2011 | Hashimoto et al. | |
| 8,050,037 B2 * | 11/2011 | Tsuyuno et al. | 361/714 |
| 8,184,438 B2 * | 5/2012 | Kaneko et al. | 361/705 |
| 8,339,801 B2 * | 12/2012 | Tominaga et al. | 361/775 |
| 8,373,990 B2 * | 2/2013 | Jarmany | 361/707 |
| 2003/0133280 A1 * | 7/2003 | Tsuzuki | 361/797 |
| 2008/0310131 A1 * | 12/2008 | Fino et al. | 361/758 |
| 2010/0127602 A1 * | 5/2010 | Rueggen et al. | 310/68 D |
| 2011/0194255 A1 * | 8/2011 | Yamashita et al. | 361/711 |
| 2011/0310560 A1 * | 12/2011 | Jarmany | 361/697 |
| 2012/0069532 A1 * | 3/2012 | Azumi et al. | 361/752 |

* cited by examiner

FIRST EMBODIMENT

SECOND EMBODIMENT

THIRD EMBODIMENT

FOURTH EMBODIMENT

FIFTH EMBODIMENT

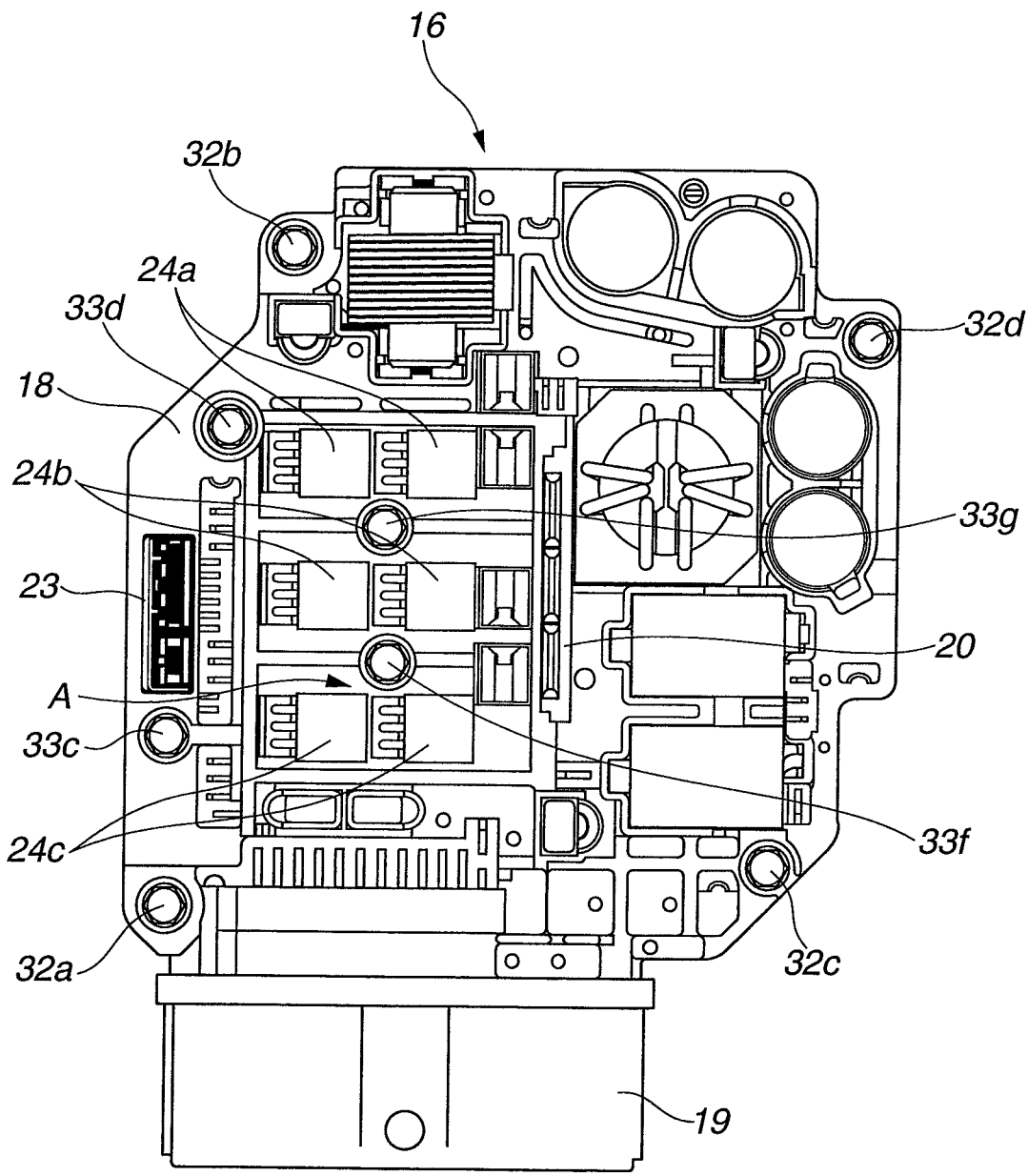

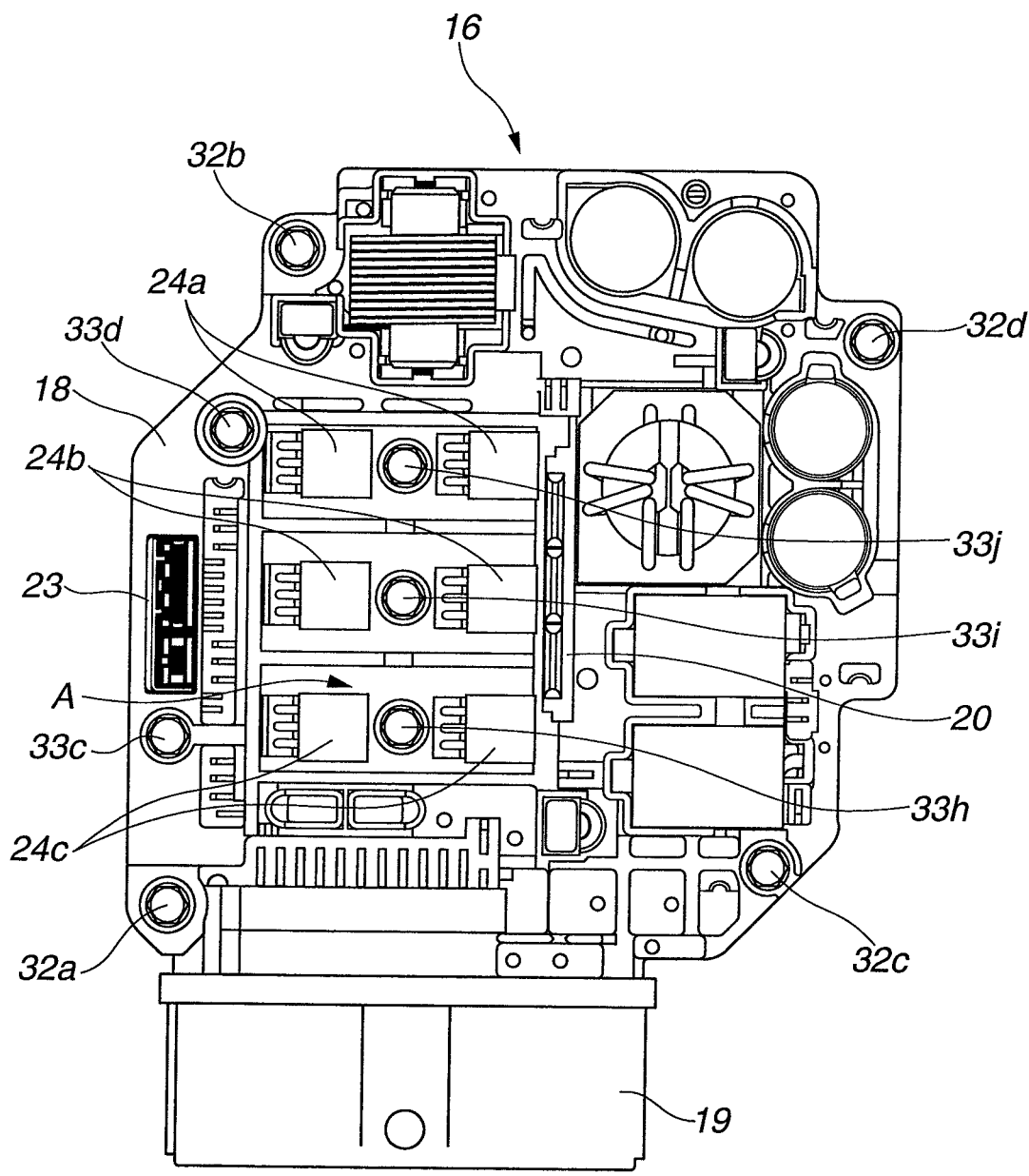

ELECTRONIC CONTROL DEVICE

BACKGROUND OF THE INVENTION

1. Field of the Invention

The present invention relates in general to an electronic control device that comprises a case in which a circuit board having a heat generating part mounted thereon is installed.

2. Description of the Related Art

In Japanese Laid-open Patent Application (tokkai) 2009-224708, there is disclosed an electronic control device which comprises a case that is made of a metal having a high thermal conductivity, a plastic bus bar board that is installed in the case and placed on a shelf portion defined by the case and a printed circuit board that is mounted over the bas bar board. To the bus bar board, there is connected a MOSFET (viz., metal oxide silicon field effect transistor) through drain, gate and source terminals. As is known, the MOSFET is an electric element that generates heat when electrically energized.

For promoting a heat radiation from the MOSFET to cool the same, the MOSFET is placed on a flat part of the case in a manner to make an intimate contact to the flat part. That is, the flat part of the case is used as a so-called heat sink.

SUMMARY OF THE INVENTION

However, in known electronic control devices such as the above-mentioned device, the plastic bus bar board tends to show a warp or deformation particularly at the time of producing the same through an insert molding. If the plastic bus bar board having such warp is set in the case without removing the warp, the intimate contact between the MOSFET (viz., heat generating element) and the flat part of the case is not obtained. In this case, the heat transmission from the MOSFET (viz., heat generating element) to the case is not effectively carried out.

Accordingly, it is an object of the present invention to provide an electronic control device that is free of the above-mentioned drawback.

In accordance with the present invention, there is provided an electronic control device which is constructed to allow a heat generating element mounted on a bus bar board (or circuit board) to exhibit a satisfied heat radiation therefrom even if the bus bar board (or circuit board) has been molded with a warp.

In accordance with a first aspect of the present invention, there is provided an electronic control device which comprises a circuit board (18) having a heat generating part (24) mounted thereon; a case (12) for installing therein the circuit board (18), the case (12) having a heat receiving portion (38) that is in contact with the heat generating part (24); at least two first fixing units (61, 32) that are constructed and arranged to fix a peripheral portion of the circuit board (18) to the case (12); and at least one second fixing unit (62, 33) that is arranged to fix a given area (A) of the circuit board (18) to the case (12) while pressing the given area (A) against the heat receiving portion (38) through the heat generating part (24), the given area (A) being an area where the heat generating part (24) is placed.

In accordance with a second aspect of the present invention, there is provided an electronic control device which comprises a first circuit board (18) having a heat generating part (24) mounted thereon; a second circuit board (17) mounted over the first circuit board (18) through a plurality of snap-fit units (47) formed on the second first circuit board (18); a case (12) for installing therein the first and second circuit boards (18, 17), the case (12) having a raised portion (38) of which flat top surface faces a major surface of the heat generating part (24) of the first circuit board (18); and inside connecting bolts (62) that secure the first circuit board (18) to the case (12) in such a manner that the major surface of the heat generating part (24) intimately contact to the flat top surface of the raised portion (38), each inside connecting bolt (62) being engaged with a threaded opening (38a) formed at the flat top surface of the raised portion (38) of the case (12) after passing through an inside connecting hole (33a, 33b, 33c or 33d) formed in the first circuit board (18); and outside connecting bolts (61) that secure the first circuit board (18) to the case (12), each outside connecting bolt (61) being engaged with a threaded opening (37a) formed at a peripheral portion of the case (12) after passing through an outside connecting hole (32a, 32b, 32c or 32d) formed in the first circuit board (18).

BRIEF DESCRIPTION OF THE DRAWINGS

Other objects and advantages of the present invention will become apparent from the following description when taken in conjunction with the accompanying drawings, in which:

FIGS. 11A and 11B are schematically illustrated side views of a flat base portion of the power module, in which FIG. 11A is a view taken before the flat base portion is bolted to given portions of the case, and FIG. 11B is a view taken after the flat base portion is bolted to the given portions of the case;

FIGS. 12A and 12B are schematically illustrated side views of the power module, in which FIG. 12A is a view taken before the flat base portion of the power module is bolted to the given portions of the case and FIG. 12B is a view taken after the flat base portion is bolted to the given portions of the case;

FIGS. 13A and 13B are schematically illustrated side views of the flat base portion of the power module together with a control module, in which FIG. 13A is a view taken before the flat base portion is bolted to the given portions of the case and FIG. 13B is a view taken after the flat base portion is bolted to the given portions of the case;

FIG. 19 is a view similar to FIG. 14, but showing a sixth embodiment of the present invention in which the layout of the inside mounting holes is different from those of the first, second, third, fourth and fifth embodiments; and FIG. 20 is a view similar to FIG. 14, but showing a seventh embodiment of the present invention in which the layout of the inside mounting holes is different from those of the first, second, third, fourth, fifth and sixth embodiments.

DETAILED DESCRIPTION OF THE EMBODIMENTS

In the following, seven embodiments of an electronic control device of the present invention will be described in detail with reference to the accompanying drawings.

For ease of understanding, various directional terms, such as, right, left, upper, lower, rightward and the like are used in the following description. However, such terms are to be understood with respect to only a drawing or drawings on which corresponding part or portion is shown.

First, a first embodiment of the present invention will be described in detail with reference to FIGS. 1 to 14.

Figure 1:
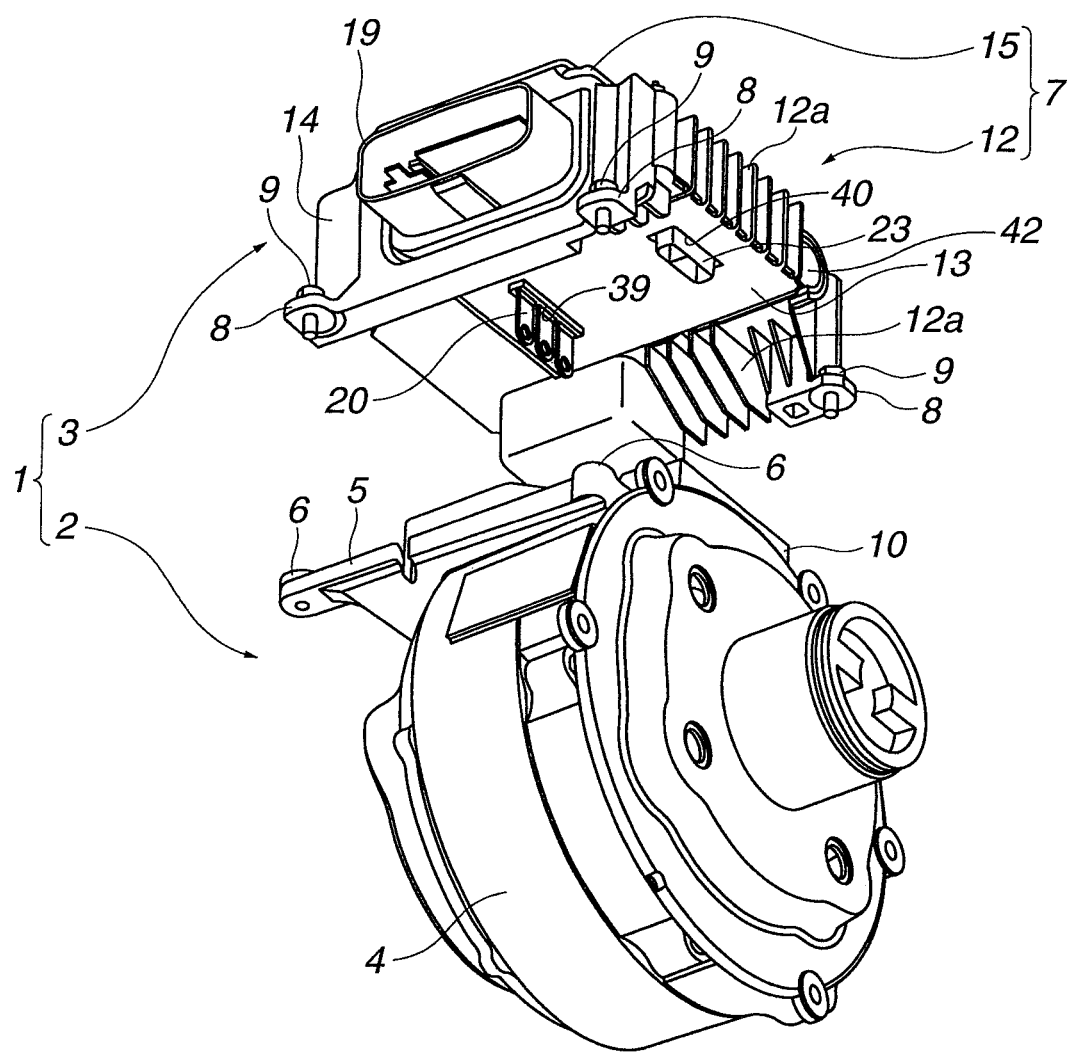
FIG. 1 is an exploded perspective view of an actuator unit that comprises an electric motor and an electronic control device of a first embodiment of the present invention.
Figure 2:
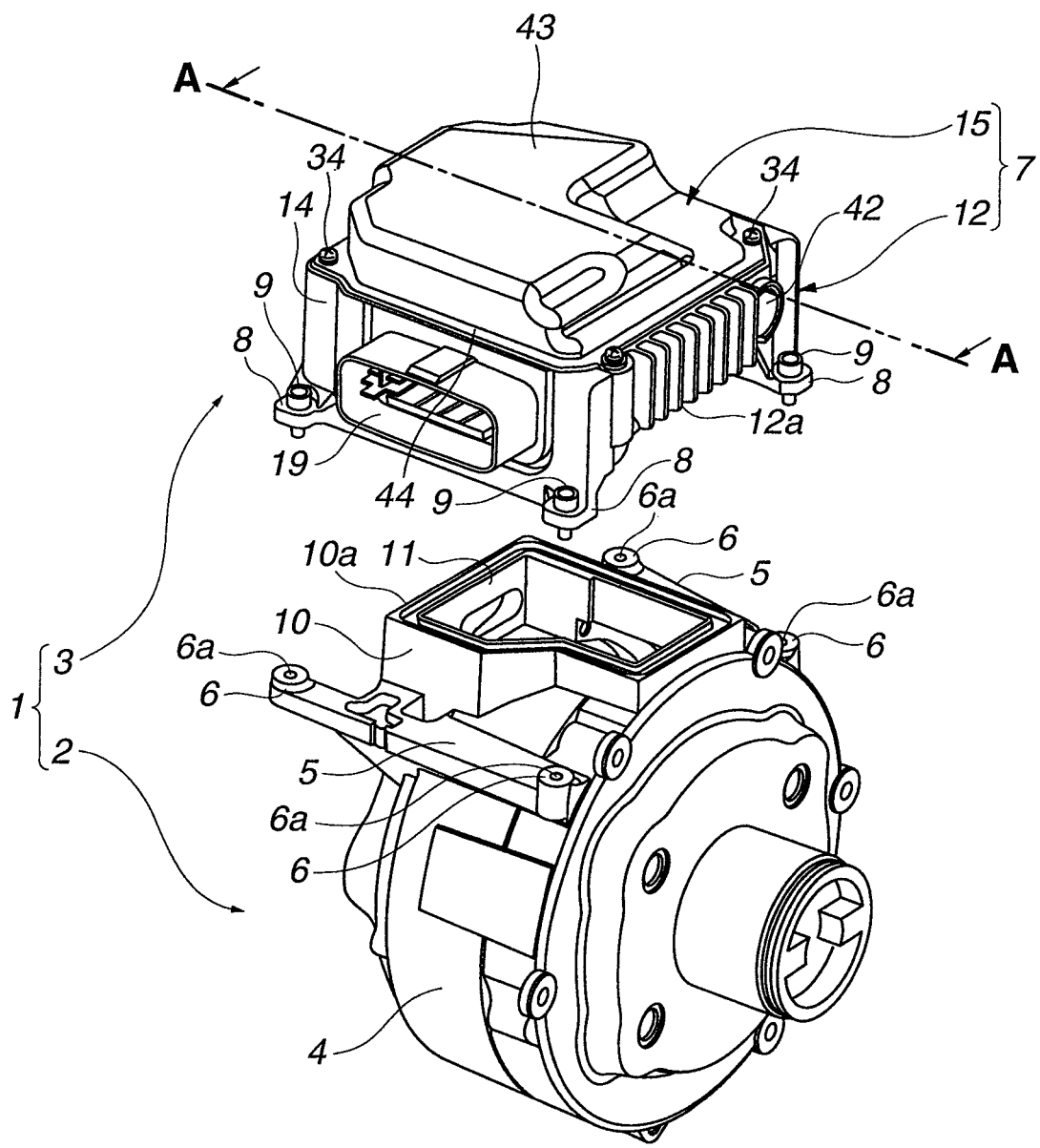
FIG. 2 is a view similar to FIG. 1, but showing a view taken from a different angle.

Referring to FIGS. 1 and 2, there is shown an actuator unit 1 which is used in an electric power braking device mounted on a motor vehicle.

Actuator unit 1 comprises an electric motor 2 that is driven by a power of three-phase alternating current and used as an actuator for actuating a hydraulic pressure of a brake liquid and a motor control device (or electronic control device) 3 that controls operation of electric motor 2 in accordance with a brake pedal operation by a driver and an operation condition of an associated motor vehicle. Although not shown in the drawings, by the operation of electric motor 2, a ball-screw mechanism moves a piston forward and backward for controlling the hydraulic pressure of the brake liquid.

As is seen from FIG. 2, a cylindrical motor housing 4 of electric motor 2 is formed with two pedestal portions 5 that extend in an axial direction of electric motor 2. As shown, the two pedestal portions 5 are spaced from each other in a direction perpendicular to the axial direction of the electric motor 2. Each pedestal portion 5 is formed at both ends with cylindrical bosses 6 each having a mounting flat top surface and a threaded opening 6a.

As is seen from FIG. 2, an after-mentioned case 12 of a housing 7 of motor control device 3 is formed with four leg portions 8 that are to be put on the flat top surfaces of the cylindrical bosses 6 of motor housing 4. Due to four connecting screws 9 that are engaged with threaded openings 6a of pedestal portions 5 after passing through bolt openings (no numerals) provided by four leg portions 8, motor control device 3 is tightly mounted on electric motor 2.

As is seen from FIG. 2, motor housing 4 is formed at a portion between pedestal portions 5 with a generally rectangular walled open portion 10, so that when, as is seen from FIG. 1, a housing 7 of motor control device 3 is tightly mounted on motor housing 4 in the above-mentioned manner, a stator connecting male portion (or electric plug unit) 20 and a sensor connecting female portion 23 (see FIG. 1) of motor control device 3 are exposed to an interior of motor housing 4 through an opening 11 defined by the walled open portion 10.

As will be described in detail hereinafter, upon assembly of actuator unit 1, stator connecting male portion 20 is coupled with a stator connecting female portion (not shown) provided in motor housing 4 to establish an electric connection between motor control device 3 and a stator (not shown) installed in motor housing 4.

Figure 7:
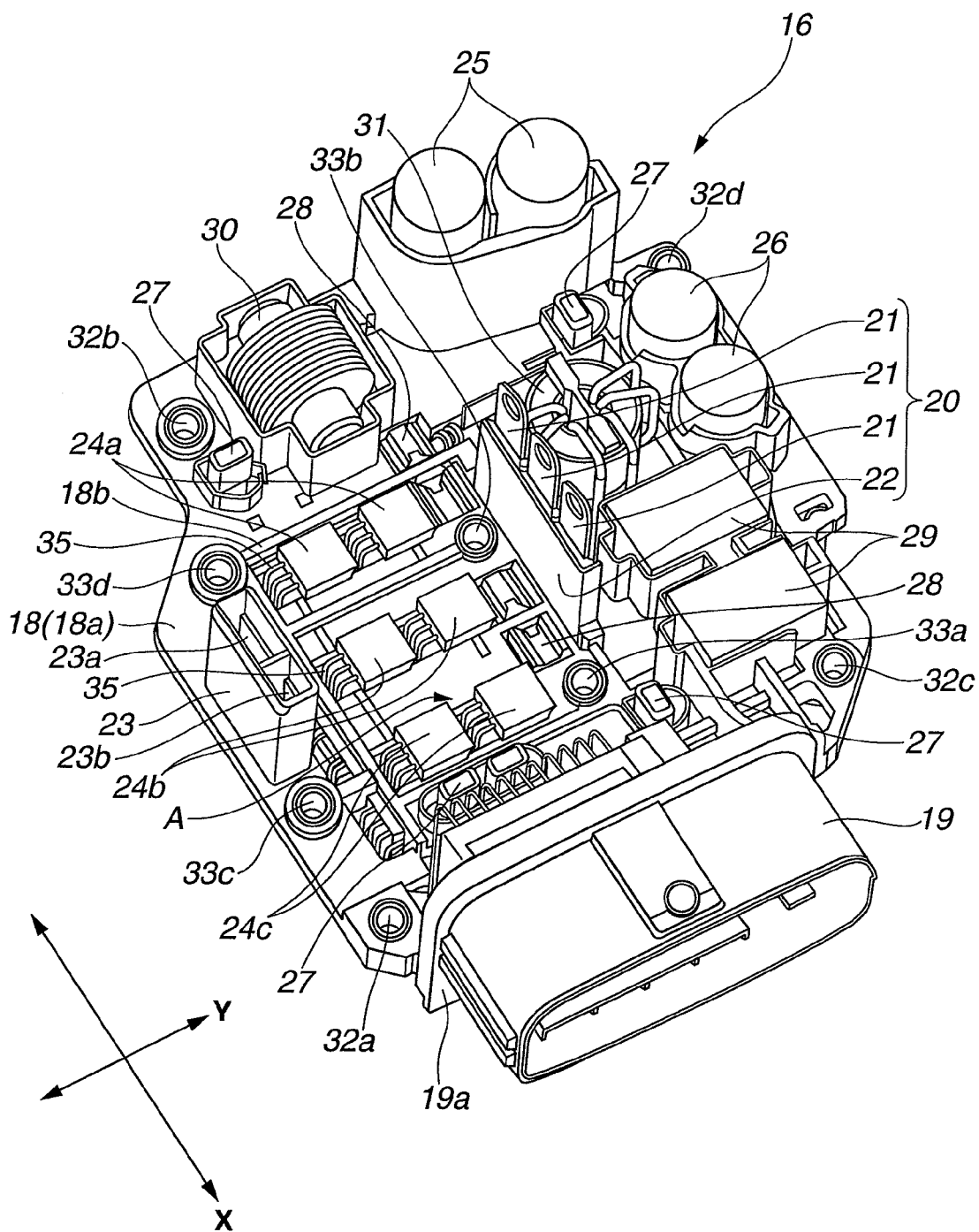
FIG. 7 is a perspective back view of a power module employed in the electronic control device of the first embodiment.

As will be understood from FIGS. 1 and 7, sensor connecting female portion 23 is of an integral type which consists of one connector 23a that is to be connected to an angular position sensor and the other connector 23b that is to be connected to a temperature sensor. More specifically, to the connector 23a, there is detachably connected a leading end of a harness (not shown) extending from the angular position sensor installed in motor housing 4, and to the other connector 23b, there is detachably connected a leading end of the other harness (not shown) extending from the temperature sensor installed in motor housing 4.

The angular position sensor is a device for detecting an angular position of a rotor of electric motor 2, that is installed in motor housing 4, and an output signal from the angular position sensor is used for controlling operation of electric motor 2 through motor control device 3. The temperature sensor is a device for detecting an operation temperature of electric motor 2, more specifically, for detecting a temperature of a coil (not shown) of electric motor 2.

Referring back to FIG. 2, the walled open portion 10 of motor housing 4 is formed at its ridge with an endless groove 10a in which a seal member (not shown) is operatively installed. Due to work of the seal member, a hermetically sealed connection between electric motor 2 and motor control device 3 is obtained when case 12 of housing 7 is properly mounted on walled open portion 10 of electric motor 2.

Figure 3:
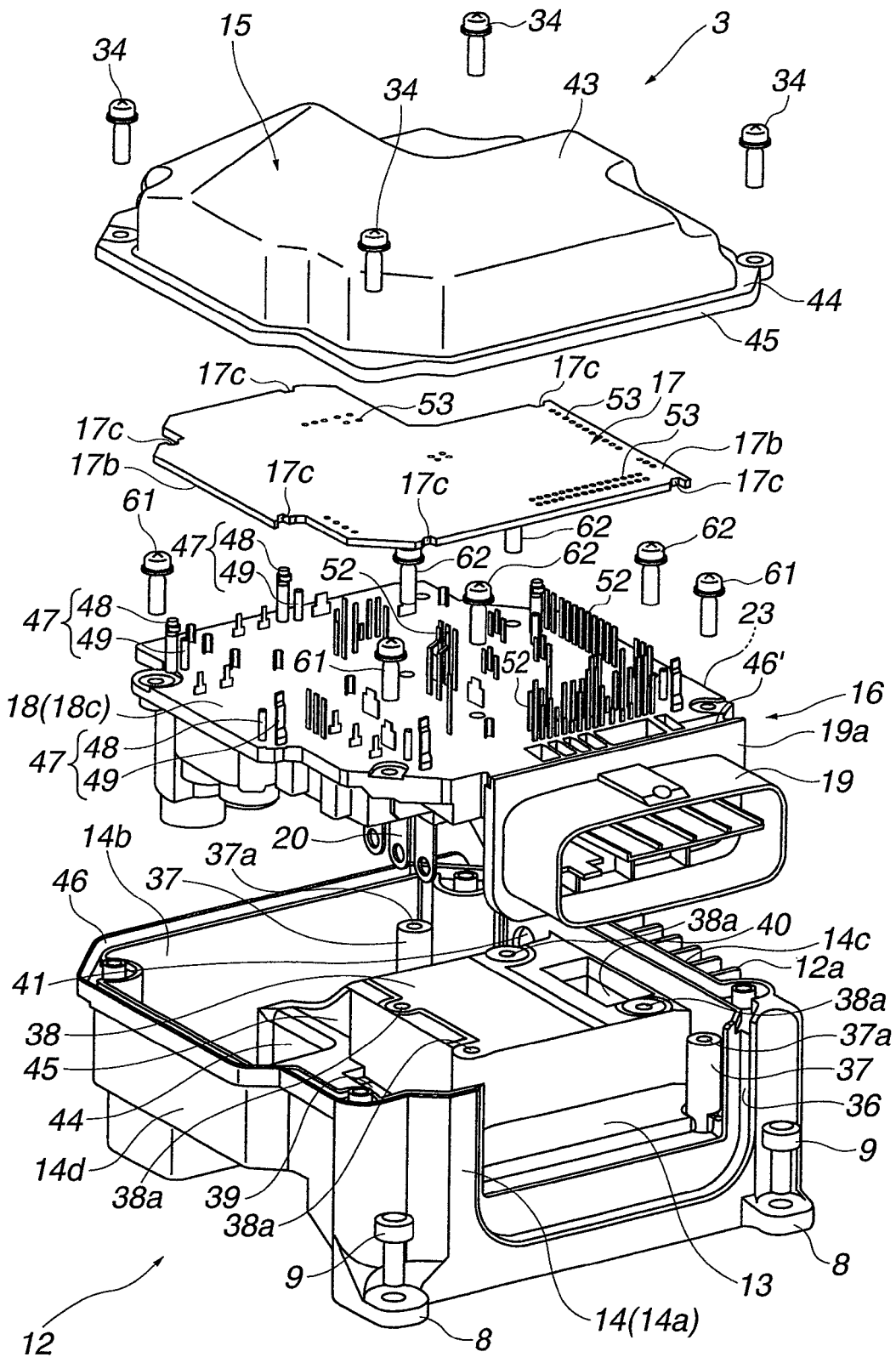
FIG. 3 is an exploded perspective view of the electronic control device of the first embodiment.

As is seen from FIGS. 1, 2 and 3, housing 7 of motor control device 3 includes generally a case 12 and a cover 15. As is best seen from FIG. 3, case 12 is shaped like a square box that includes a bottom wall 13 and a surrounding wall 14 by which a square interior space is defined.

In FIG. 3, the interior space of case 12 has an upper open end exposed to the outside. Cover 15 is shaped like a swelled square lid and used for being put on case 12 to close the upper open end of the interior space of case 12.

As is seen from FIG. 3, in housing 7, there are installed a power module 16 that includes a flat base portion 18 that has a first circuit board mounted thereon and a control module 17 that has a second circuit board mounted thereon.

Figure 4:
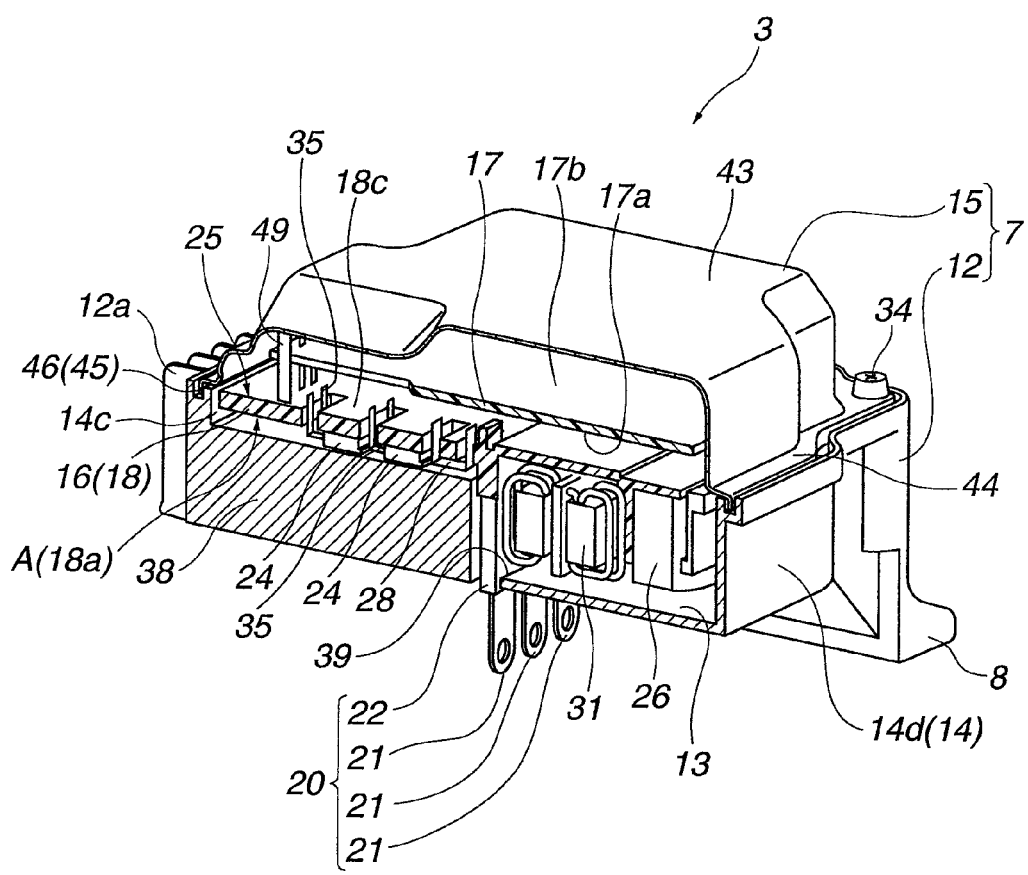
FIG. 4 is a perspective cut view of the electronic control device taken along the line A-A of FIG. 2.

More specifically, as is seen from FIGS. 3 and 4, power module 16 is located just above bottom wall 13 of case 12, and control module 17 is located above power module 16 keeping a certain distance therebetween. As will be understood from FIG. 1, upon mounting of housing 7 onto motor housing 4, a back surface of bottom wall 13 of case 12 is directed toward motor housing 4.

As is seen from FIGS. 3 and 4, cover 15 is produced by pressing a metal plate and comprises an upwardly swelled portion 43, a flange portion 44 extending around a periphery of swelled portion 43 and a downwardly projected ridge portion 45 formed around flange portion 44.

Figure 5:
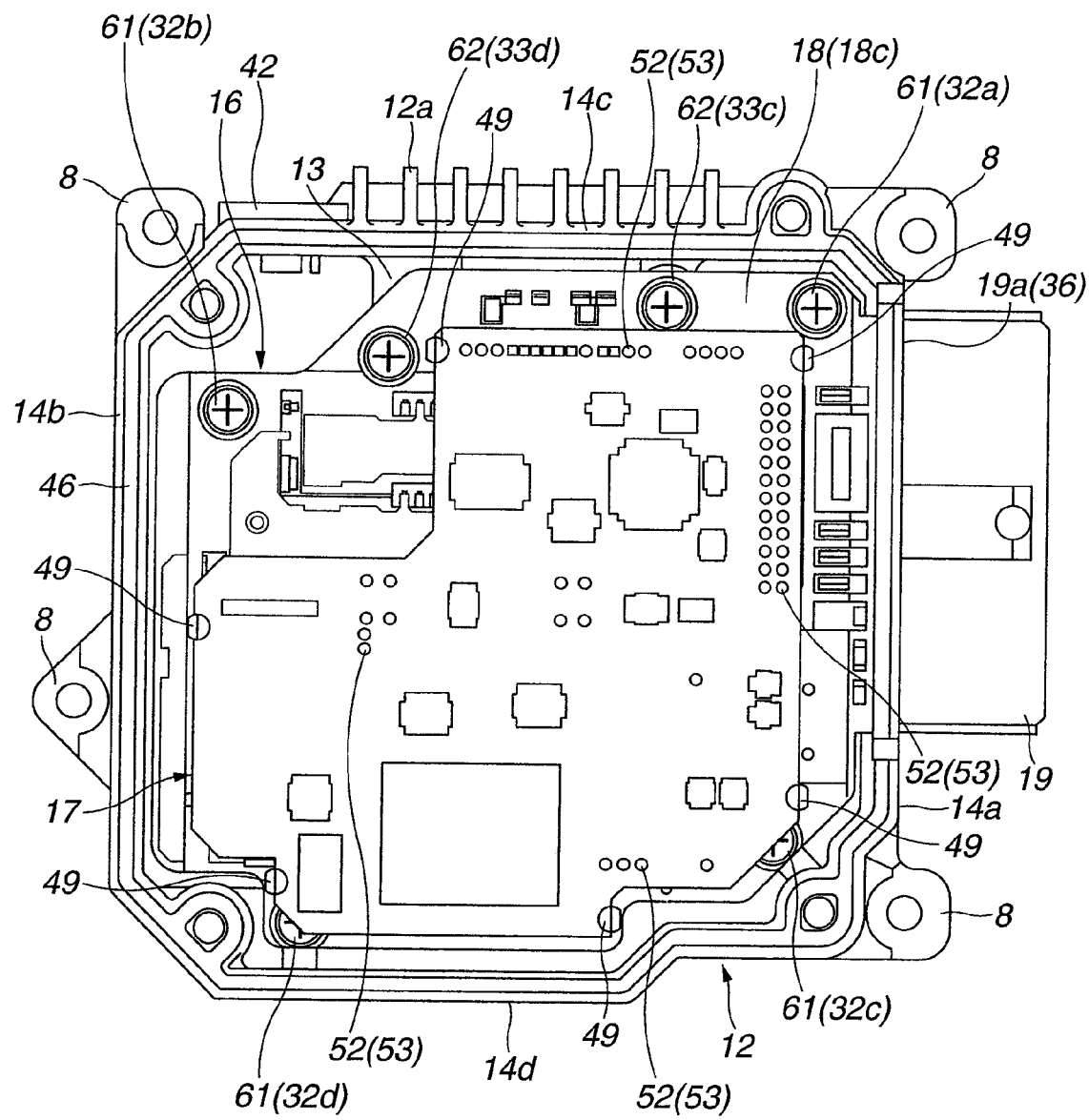
FIG. 5 is a plan view of the electronic control device of the first embodiment with a cover removed.
Figure 6:
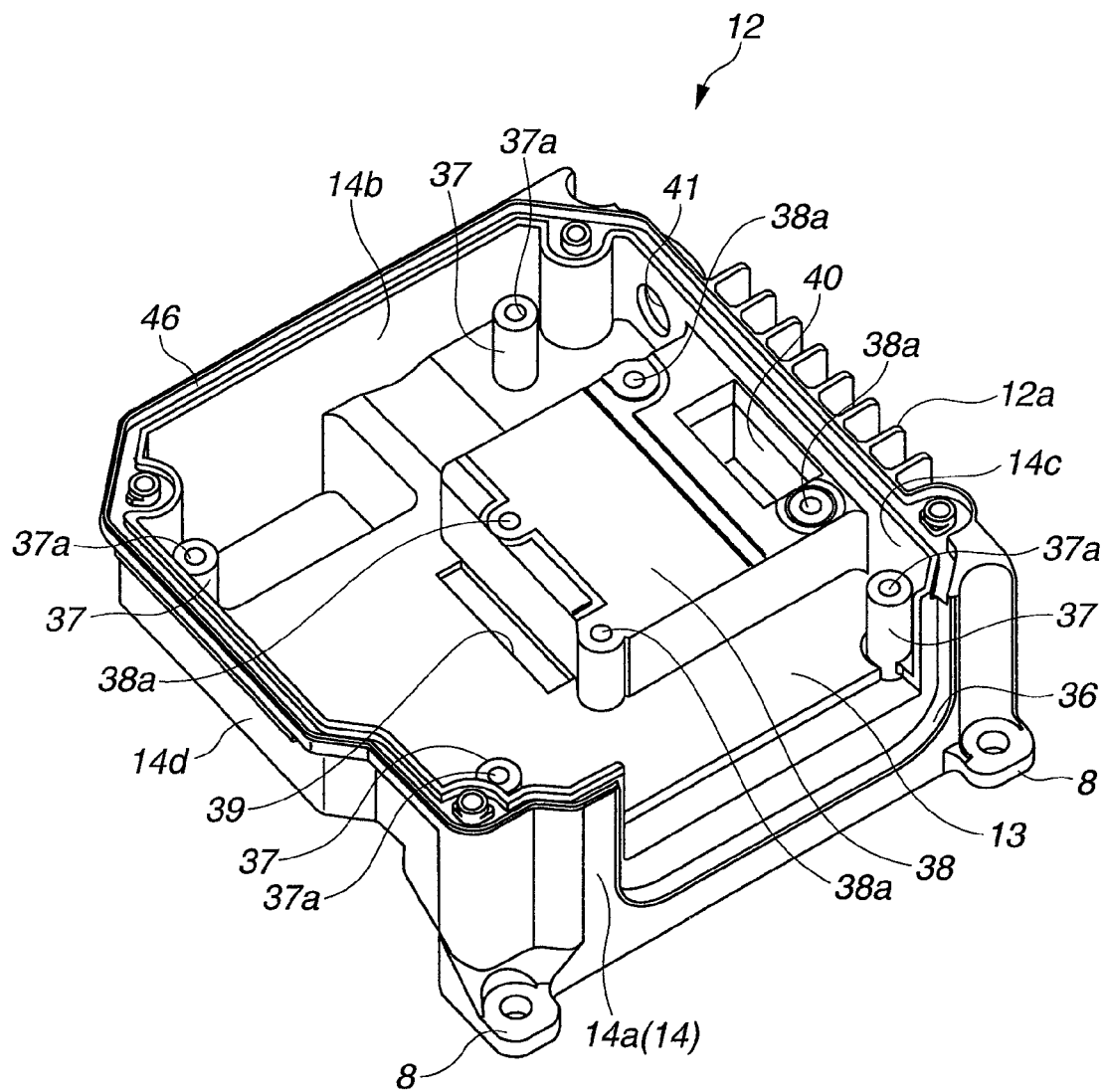
FIG. 6 is a perspective upper view of a case employed in the electronic control device of the first embodiment.

Referring to FIGS. 4 to 6, case 12 is made of an aluminum alloy with a good thermal conductivity and is produced through an aluminum die-casting method.

As is seen from FIGS. 3 and 6, surrounding wall 14 of case 12 is formed at one side part (or first wall part) 14a thereof with an enlarged recess 36 through which a tubular electric connector 19 of power module 16 extends outward. The other side part (or second wall part) of surrounding wall 14 is designated by numeral 14b. The other two side parts (or third and fourth parts) of surrounding wall 14 are designated by numerals 14c and 14d.

The shape of the enlarged recess 36 coincides with that of a flange 19a formed at a root of tubular electric connector 19. A periphery of flange 19a is bonded to a peripheral edge of the enlarged recess 36 through a seal member (not shown).

In FIGS. 3 to 6, denoted by numeral 12a is a plurality of cooling fines that are integrally formed on an outer surface of the third wall part 14c of case 12.

As is seen from FIG. 3, surrounding wall 14 of case 12 is formed at its upper edge with an elongate seal groove 46, and flange 19a of the tubular electric connector 19 is formed at its upper edge with a straight seal groove 46'. These two seal grooves 46 and 46' constitute an endless seal groove (46+46') when the power module 16 is properly installed in case 12.

For coupling cover 15 with case 12, the downwardly projected ridge portion 45 of cover 15 is received into the endless seal groove (46+46') and four connecting bolts 34 are used for connecting cover 15 and case 15 together. Although not shown in the drawing, an adhesive and sealing material are applied to the endless seal groove for assuring a hermetical coupling between case 12 and cover 15.

As is seen from FIGS. 3 and 6, four cylindrical columns 37 are projected upward from four corner portions of bottom wall 13 of case 12 for the purpose of supporting power module 16. Each cylindrical column 37 has at its head portion a threaded opening 37a to which an after-mentioned outside connecting bolt 61 is engaged.

As is seen from FIG. 6, at a right portion of bottom wall 13 of case 12, there is projected a rectangular flat portion 38 that is used as a so-called heat sink. More specifically, upon assembly of motor control device 3, a flat upper surface of the raised rectangular flat portion 38 holds and contacts major surfaces of after-mentioned switching elements 24 that are mounted on a back surface of flat base portion 18 of power module 16. As is seen from FIG. 7, six switching elements 24 are mounted on a given zone "A" of the back surface of flat base portion 18, which will be described in detail hereinafter.

As will be mentioned hereinafter, the raised rectangular flat portion 38 serves as a heat receiving portion. In other words, raised rectangular flat portion 38 serves as a heat sink of high thermal capacity.

As is seen from FIG. 6, raised rectangular flat portion 38 is placed near the third wall part 14c of surrounding wall 14 and positioned between the first and second wall parts 14a and 14b. Raised rectangular flat portion 38 is somewhat remote from the fourth wall part 14d.

It is to be noted that raised rectangular flat portion 38 is integral with third wall part 14c of surrounding wall 14 that has cooling fins 12a integrally formed thereon.

At four corners of raised rectangular flat portion 38, there are provided threaded openings 38a to which after-mentioned inside connecting bolts 62 are engaged.

Denoted by numeral 40 in FIG. 6 is a connector receiving hole provided at raised rectangular flat portion 38 near third wall part 14c. Upon assembly of motor control device 3, connector receiving hole 40 receives therein the above-mentioned sensor connecting female portion 23 (see FIG. 1).

Denoted by numeral 39 in FIG. 6 is a power supply terminal receiving hole that is provided in bottom wall 13 near one wall of raised rectangular flat portion 38 that faces fourth wall part 14d. Upon assembly of motor control device 3, power supply terminal receiving hole 39 receives therein the above-mentioned stator connecting male portion 20 (see FIG. 1).

Denoted by numeral 41 in FIG. 6 is an opening that is provided in third wall part 14c near second wall part 14b. As will be understood from FIGS. 1 and 2, a breathing filter 42 is fitted to the opening 41. The breathing filter 42 serves to block water attack while permitting a flow of air.

Referring back to FIG. 3, power module 16 is a plastic block and is produced through injection molding.

Figure 8:
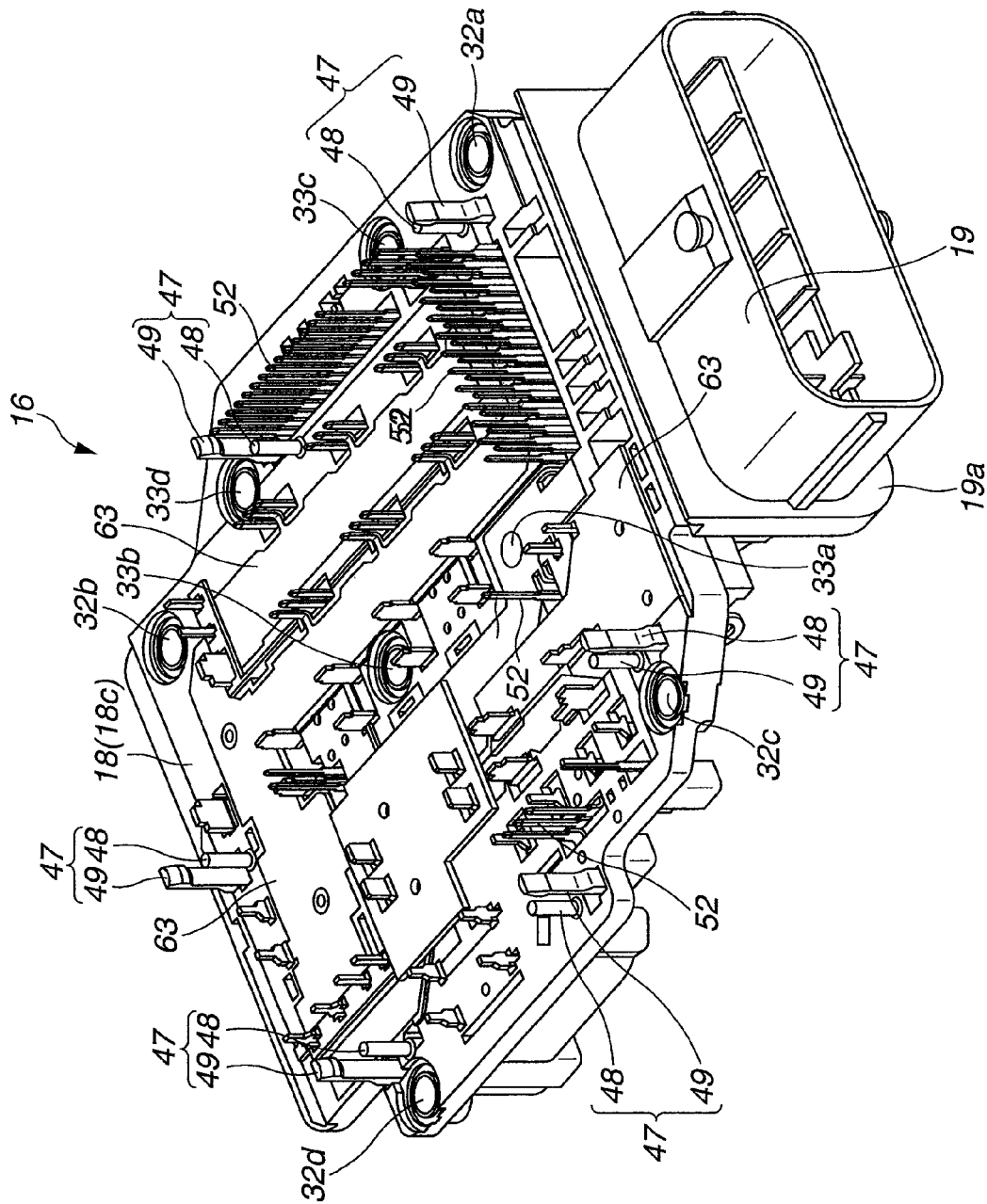
FIG. 8 is a perspective upper view of the power module of the electronic control device of the first embodiment.

As is seen from FIGS. 4, 7 and 8, power module 16 comprises a flat base portion 18 that has a plurality of metal bus bars inserted therein and thereon, the above-mentioned tubular electric connector 19 that is integrally molded at one end of the flat base portion 18 and the above-mentioned stator connecting male portion 20 and sensor connecting female portion 23 (see FIG. 7) that project downward in FIG. 3 toward bottom of case 12.

Tubular electric connector 19 is a power supply connector and exposed to the outside through the enlarged recess 36 of case 12 as has been mentioned hereinabove and will be understood from FIG. 3. Although not shown in the drawings, in use, a partner connector is plugged to tubular electric connector 19 to establish an electric connection between power module 16 and external electric elements including a power source.

As is seen from FIGS. 3 and 7, onto the back surface 18a of flat base portion 18, there are mounted a plurality of electronic parts, which are for example switching elements 24, a pair of relays 29, a normal mode coil 30, a common mode coil 31, etc., which will be discussed hereinafter in detail.

As is seen from FIG. 7, the stator connecting male portion 20 is placed at a generally middle part of the part mounting surface 18a, and the sensor connecting female portion 23 is placed at one side of the part mounting surface 18a.

As will be understood from FIG. 1, upon assembly of actuator unit 1, these male and female portions 20 and 23 project toward the interior of motor housing 4.

Figure 14:
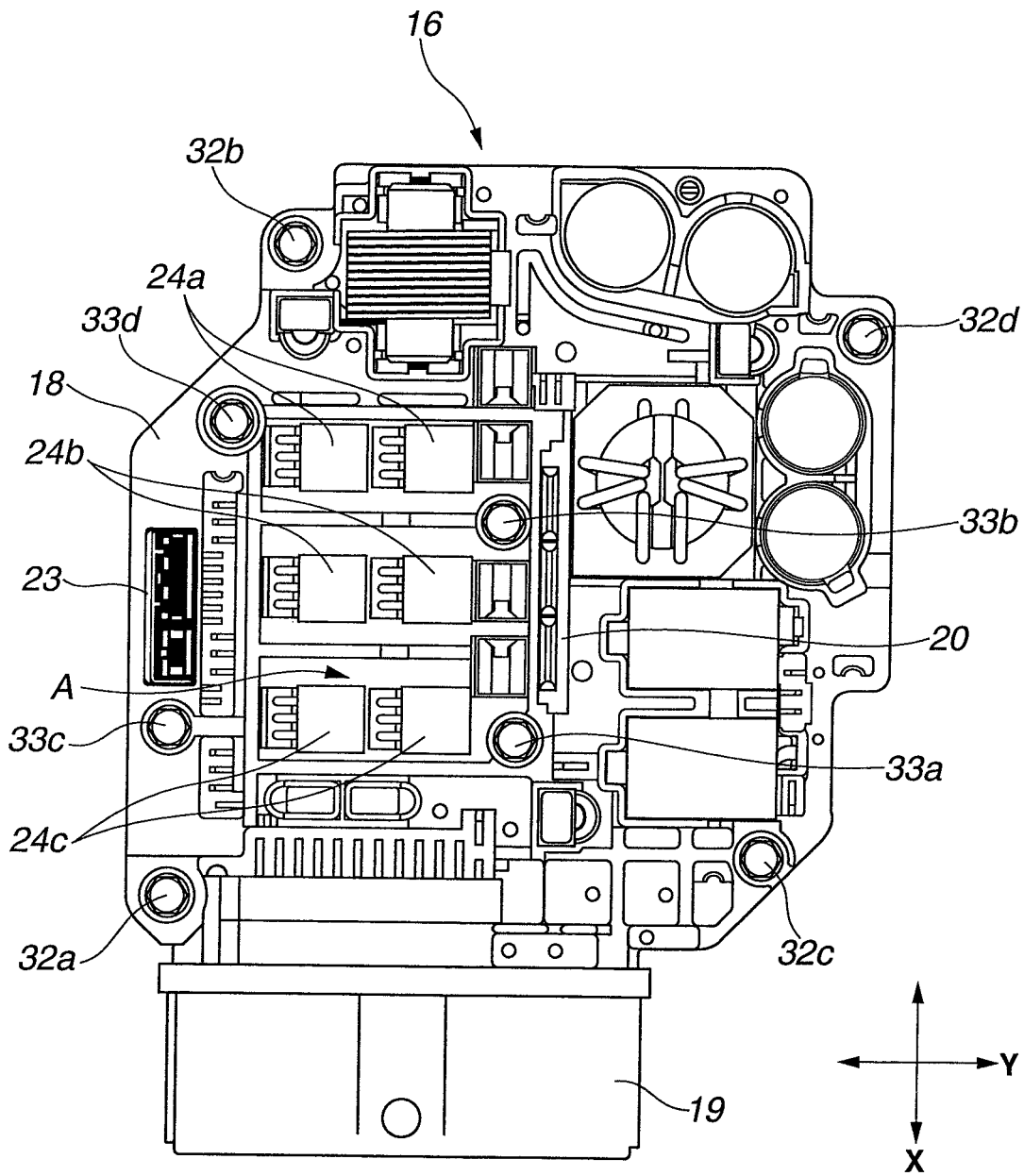
FIG. 14 is a back view of the power module employed in the electronic control device of the first embodiment showing a layout of inside mounting holes.

As is seen from FIGS. 4, 7 and 14, stator connecting male portion 20 comprises three flat terminals 21 that are aligned along an axis of tubular electric connector 19 (or in the direction of "X" in FIG. 14) and a plastic base portion 22 that is integral with flat base portion 18 and holds therein root portions of the three flat terminals 21. In use, for driving electric motor 2, three-phase alternating current is fed to electric motor 2 from an external power source through the three flat terminals 21 of stator connecting male portion 20.

As is seen from FIGS. 1 and 7, sensor connecting female portion 23 is rectangular parallelepiped in shape and includes the above-mentioned connector 23a for the angular position sensor and the above-mentioned connector 23b for the temperature sensor. These two connectors 23a and 23b are aligned in parallel with the axial direction of tubular electric connector 19. Although not well shown in the drawing, each connector 23a or 23b has a plurality of terminals installed therein.

In this first embodiment, stator connecting male portion 20 and sensor connecting female portion 23 are arranged in the above-mentioned manner. However, if desired, the layout of them may be reversed.

In the following, with the aid of FIG. 7, the various electronic parts mounted to the part mounting surface 18a (viz., back surface) of flat base portion 18 will be described.

As is seen from FIG. 7, the part mounting surface 18a has a switching element mounting zone "A" between stator connecting male portion 20 and sensor connecting female portion 23.

The zone "A" is enclosed by a rectangular ridge 18b formed on part mounting surface 18a. Within the switching element mounting zone "A", there are mounted six switching elements 24. These switching elements 24 constitute a known inverter circuit by which a direct current power fed thereto through tubular electric connector 19 is inverted to a three-phase alternating current power. The three-phase alternating current power outputted from the inverter circuit is applied to electric motor 2 through stator connecting male portion 20 to drive electric motor 2. In the first embodiment, MOSFET is used as the switching elements 24. However, if desired, other type switching elements may be used.

As is seen from FIG. 7, each switching element 24 has three terminals 35 that extend from one side thereof. These three terminals 35 are bent to connect to bus bars 63 provided on the flat base portion 18. Neighboring two among the six switching elements 24 constitute a pair of switching elements 24, and thus three pairs of switching elements 24a, 24b and 24c are arranged in the switching element mounting zone "A" in such a manner as is shown in FIG. 7. That is, "2×3" arrangement is made by the six switching elements 24.

As will be understood from FIG. 7, three pairs of switching elements 24a, 24b and 24c are arranged one after another in an axial direction of the tubular electric connector 19. The two switching elements 24 that constitute each pair are arranged in a direction perpendicular to the axial direction of the tubular electric connector 19, that is, in the direction of "Y" in FIG. 14. By these three pairs of switching elements 24a, 24b and 24c, the electric power of three-phase alternating current fed to electric motor 2 is suitably controlled.

Under operation, these six switching elements 24 generate a certain amount of heat that is undesirable to operate the motor control device 3 normally.

As will be understood when comparing FIG. 6 with FIG. 7 that is a back view of power module 16, the size of the raised rectangular flat portion 38 of case 12 is substantially the same as that of the switching element mounting zone "A" of flat base portion 18 of power module 16.

As will be understood from FIG. 3, when power module 16 is properly mounted to case 12, all of the six switching elements 24 are brought into contact with the upper flat surface of raised rectangular flat portion 38 of case 12, so that any heat generated by switching elements 24 during operation of motor control device 3 is transmitted to the raised rectangular flat portion 38.

If desired, an effective heat transmitting member, such as heat transmitting gel, heat transmitting sheet or the like, may be interposed between each switching element 24 and raised rectangular flat portion 38. Because of a surface flexibility, the heat transmitting gel or sheet can be intimately interposed between each switching element 24 and raised rectangular flat portion 38, which increases a practical contact area therebetween. Thus, heat transmission from switching elements 24 to the projected flat portion 38 is increased thereby allowing the projected flat portion 38 to serve as a highly efficient heat sink.

As is seen from FIG. 7, onto the part mounting surface 18a of flat base portion 18, there are mounted a pair of first electrolytic condensers 25 (each being cylindrical in shape), a pair of second electrolytic condensers 26 (each being cylindrical in shape) that are shorter than the first electrolytic condensers 25, a plurality of ceramic condensers 27, a plurality of shunt resistors 28 used for measuring a current, a pair of relays 29 used for protecting the circuit, a normal mode coil 30, and a common mode coil 31.

First and second electrolytic condensers 25 and 26, normal mode coil 30 and common mode coil 31 are parts for constituting a noise filtering circuit.

As is seen from FIG. 7, first electrolytic condensers 25 and normal mode coil 30 are arranged on the part mounting surface 18a at a position opposite to the position where tubular electric connector 19 is arranged. Second electrolytic condensers 26, common mode coil 31 and relays 29 are arranged on the part mounting surface 18a at a position opposite to the position where sensor connecting female portion 23 is arranged.

As shown, the switching element mounting zone "A" is placed between normal mode coil 30 and electric connector 19. In the zone "A", there are mounted the six switching elements 24.

In other words, normal mode coil 30, first electrolytic condensers 25 and tubular electric connector 19 are not placed in the zone "A". The stator connecting male portion 20 is arranged between each of normal mode coil 30 and first electrolytic condensers 25 and tubular electric connector 19, as shown.

As is understood from FIGS. 7, 8 and 14, at four corners of flat base portion 18 of power module 16, there are provided four outside connecting holes 32a, 32b, 32c and 32d (which constitute part of first fixing units), which are counter parts of the above-mentioned four cylindrical columns 37 of case 12. With respect to an axial direction of tubular electric connector 19 (viz., the direction "X" in FIG. 14), the two outside connecting holes 32a and 32c are placed near tubular electric connector 19, while the other two outside connecting holes 32b and 32d are placed away from tubular electric connector 19.

As is seen from FIGS. 7 and 8, at four corners of switching element mounting zone "A" of flat base portion 18 of power module 16, there are provided four inside connecting holes 33a, 33b, 33c and 33d (which constitute part of second fixing units), which are respectively aligned with the above-mentioned four threaded openings 38a of the raised rectangular flat portion 38 of case 12 when power module 16 is properly mounted on case 12.

As is seen from FIG. 7, these four inside connecting holes 33a, 33b, 33c and 33d constituting part of the second fixing units are placed nearer to the switching elements 24 than the four outside connecting holes 32a, 32b, 32c and 32d constituting part of the first fixing units are. More specifically, the four inside connecting holes 33a, 33b, 33c and 33d are placed within a zone that is substantially defined by the four outside connecting holes 32a, 32b, 32c and 32d.

Furthermore, as is seen from FIGS. 7, 8 and 14, with respect a direction generally perpendicular to the axial direction of tubular electric connector 19, first and second inside connecting holes 33a and 33b are placed between each of first and second outside connecting holes 32a and 32b and each of third and fourth outside connecting holes 32c and 32d, and third and fourth inside connecting holes 33c and 33d are placed at one side of flat base portion 18 where sensor connecting female portion 23 is provided. That is, at one side of switching element mounting zone "A" with respect to an axial direction of tubular electric connector 19, there are arranged first and second inside connecting holes 33a and 33b, and at the other side of the zone "A" with respect to the axial direction of tubular electric connector 19, there are arranged third and fourth inside connecting holes 33c and 44d, as shown.

First and third inside connecting holes 33a and 33c are spaced from each other in a direction generally perpendicular to the axial direction of tubular electric connector 19, and like this, second and fourth inside connecting holes 33b and 33d are spaced from each other in the direction generally perpendicular to the axial direction of tubular electric connector 19.

With respect to a direction perpendicular to the axial direction of tubular electric connector 19, first and second inside connecting holes 33a and 33b are arranged between the group of the six switching elements 24 and stator connecting male portion 20. These first and second inside connecting holes 33a and 33b are arranged on an imaginary line that extends along the axial direction of tubular electric connector 19.

With respect to the "2×3" arrangement of switching elements 24, the two inside connecting holes 33a and 33b are arranged on an imaginary line that extends along the axial direction (viz., the direction "X" of FIG. 14) of tubular electric connector 19, that is, along the imaginary line on which the three pairs of switching elements 24a, 24b and 24c are arranged. Like this, the other two inside connecting holes 33c and 33d are arranged on an imaginary line that extends along the imaginary line on which the three pairs of switching elements 24a, 24b and 24c are arranged.

Figure 10:
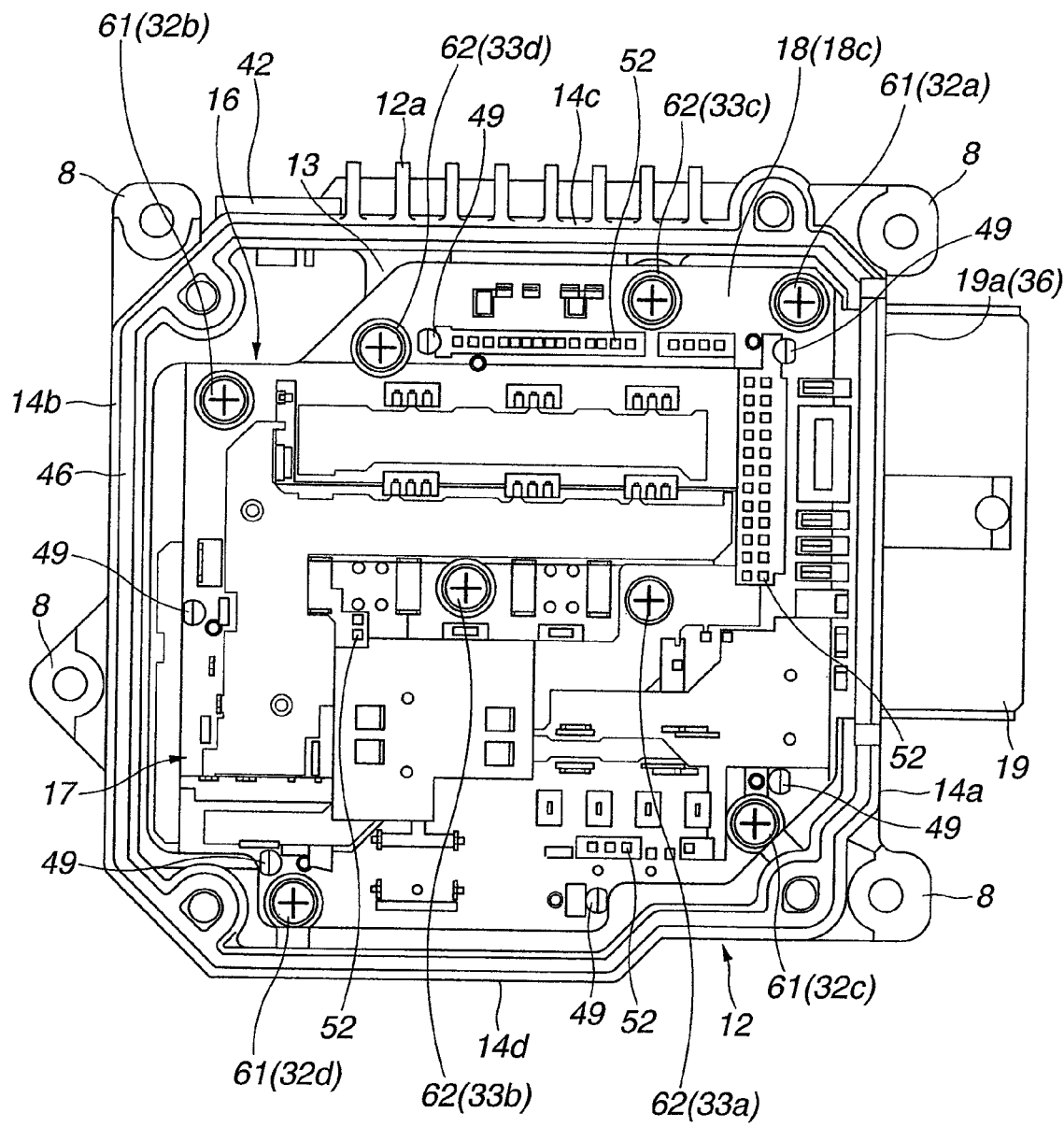
FIG. 10 is a plan view of the power module installed in the case.

As will be understood from FIGS. 3 and 10, power module 16 is secured to the four cylindrical columns 37 of case 12 by four outside connecting bolts 61 that pass through outside connecting holes 32a, 32b, 32c and 32d, and the switching element mounting zone "A" of flat base portion 18 of power module 16 is secured to raised rectangular flat portion 38 of case 12 by four inside connecting bolts 62 that pass through inside connecting holes 33a, 33b, 33c and 33d.

After passing through outside connecting holes 32a, 32b, 32c and 32d, outside connecting bolts 61 are respectively engaged with threaded openings 37a of four cylindrical columns 37 of case 12, and after passing through inside connecting holes 33a, 33b, 33c and 33d, inside connecting bolts 62 are respectively engaged with threaded openings 38a of raised rectangular flat portion 38 of case 12.

It is to be noted that outside connecting holes 32a, 32b, 32c and 32d and outside connecting bolts 61 constitute the above-mentioned first fixing units, and inside connecting holes 33a, 33b, 33c and 33d and inside connecting bolts 62 constitute the above-mentioned second fixing units.

As is seen from FIGS. 3 and 8, on an upper surface 18c of flat base portion 18 of power module 16, there are integrally formed a plurality of snap-fit units 47 through which the above-mentioned control module 17 are detachably held by flat base portion 18 of power module 16.

From the upper surface 18c of flat base portion 18, there project upward a plurality of connecting terminals 52 that extend from various electronic parts mounted to the lower surface of flat base portion 18 of power module 16. As will be clarified in detail hereinafter, due to connecting terminals 52, control module 17 and power module 16 are electrically connected.

In the following, snap-fit units 47 will be described in detail with the aid of the drawings, especially FIG. 9 that is an enlarged view of one of snap-fit units 47. Due to snap-fit units 47, control module 17 is resiliently held over power module 16. Since these snap-fit units 47 are the same in construction, only one of them will be described with reference to FIG. 9.

Figure 9:
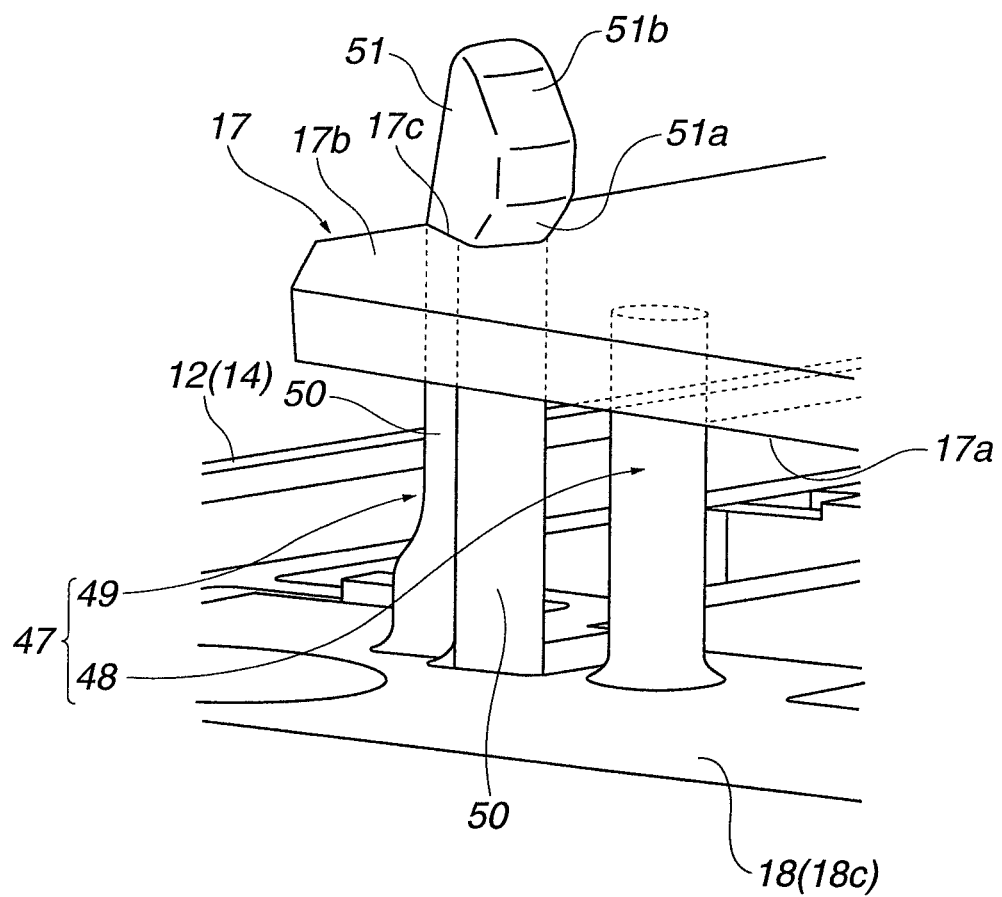
FIG. 9 is an enlarged perspective view of one of snap-fit projections integrally formed on a flat base portion showing a condition wherein the snap-fit projection supports a control module.

As is seen from FIG. 9, snap-fit unit 47 is a plastic unit integrally molded as a part of flat base portion 18 of power module, and comprises a cylindrical support column 48 that supports thereon a lower surface 17a of control module 17 and a catch column 49 that is placed beside cylindrical support column 48.

Catch column 49 comprises a pole 50 that projects upward from flat base portion 18 of power module 16 and has a rectangular cross section and a pawl 51 that is integrally formed on a top of pole 50 and inclined in a given direction, that is toward control module 17 to be placed at the correct position, as shown.

As is understood from FIG. 9, when control module 17 is shifted down and put on tops of cylindrical support columns 48, pawl 51 of each catch column 49 is brought into engagement with an edge portion 17b of control module 17 in a snap-action manner. With this, control module 17 is assuredly and resiliently held on cylindrical support columns 48.

More specifically, pawl 51 of each catch column 49 has an inclined lower surface 51a that is to be engaged with edge portion 17b of control module 17 and an inclined upper surface 51b through which edge portion 17b of control module 17 slides downward to be engaged with inclined lower surface 51a.

Upon assembly, control module 17 is seated on the tops of cylindrical support columns 48 and inclined lower surfaces 51a of pawls 51 of snap-fit units 47 are engaged with the edge portion 17b of control module 17. With this, as will be seen from FIGS. 4 and 9, control module 17 is placed in cover 15 keeping an assured positioning relative to flat base portion 18 of power module 16.

That is, control module 17 is neatly received in the swelled portion 43 of cover 15. Actually, for the engagement of pawls 51 of catch columns 49 with control module 17, the latter is formed with a plurality of cuts 17c as will become apparent as the description proceeds.

As is seen from FIGS. 3 and 9, control module 17 comprises a base plate that is constructed of a non-conducting plastic, such as glass-fiber pregnant epoxy resin or the like, circuit patterns that are printed on upper and lower surfaces of the base plate and various electronic parts (not shown) that are mounted on the circuit patterns.

As is seen from FIG. 3, a peripheral portion (or edge portion 17b) of the base plate of control module 17 is formed with a plurality of cuts 17c into which the above-mentioned pawls 51 of the snap-fit units 47 of power module 16 are inserted when it is intended to properly mount control module 17 over power module 16. Due to provision of snap-fit units 47, control module 17 is positioned above power module 16.

As is seen FIGS. 3 and 5, control module 17 is formed with a plurality of through holes 53 at positions corresponding to the positions where connecting terminals 52 of power module 16 are arranged. Each through hole 53 is equipped with a metal ring. Through holes 53 receive the connecting terminals 52 causing leading ends of connecting terminals 52 to project upward therefrom. The projected portion of each connecting terminal 52 is soldered at its root portion to its associated through hole 53. Although not shown in the drawing, metal rings of through holes 53 are connected to given portions of the circuit patterns that are printed on the upper surface of control module 17.

Control module 17 receives various information signals from various sensors through one group of connecting terminals 52, and by processing the information signals, control module 17 issues various instruction signals to switching elements 24 through the other group of connecting terminals 52. With this, switching elements 24 are operated in a manner to suitably drive electric motor 2.

In the following, steps for assembling motor control device 3 will be described with the aid of the drawings, especially FIGS. 3 and 7.

As will be understood from FIGS. 3 and 7, at first, power module 16 is mounted in case 12.

For this mounting, power module 16 is placed into case 12 while inserting stator connecting male portion 20 and sensor connecting female portion 23 of powder module 16 into power supply terminal receiving hole 39 and connector receiving hole 40 of case 12 respectively. Upon this, flat base portion 18 of power module 16 is seated on the tops of four cylindrical columns 37 of case 12.

Then, as will be understood from FIGS. 3 and 10, by using four outside connecting bolts 61 and four inside connecting bolts 62 in the above-mentioned manner, power module 16 is tightly secured to case 12. That is, four outside connecting bolts 61 passing through outside connecting holes 32a, 32b, 32c and 32d of power module 16 are engaged with threaded openings 37a of four cylindrical columns 37 of case 12, and four inside connecting bolts 62 passing through inside connecting holes 33a, 33b, 33c and 33d of power module 16 are engaged with four threaded openings 38a formed at the raised rectangular flat portion 38 of case 12.

For producing power module 16, a so-called insert molding technique is used. That is, as will be imagined from FIG. 8, for the production, bus bars 63 are set in a mold and then a molten plastic is injected into the mold. In the illustrated embodiment, almost all of bus bars 63 are exposed to the outer surface of flat base portion 18 of power module 16. Thus, the thickness of flat base portion 18 is minimized and thus the size of power module 16 can be reduced. Of course, all of bus bars 63 may be embedded in flat base portion 18.

In case of using the insert molding technique through which power module 16 is produced, a difference in thermal expansion between the bus bars (viz., metal members) and the plastic portion (viz., flat base portion 18) tends to provide flat base portion 18 of the product (viz., power module 16) with an undesired warp.

Figure 11A:
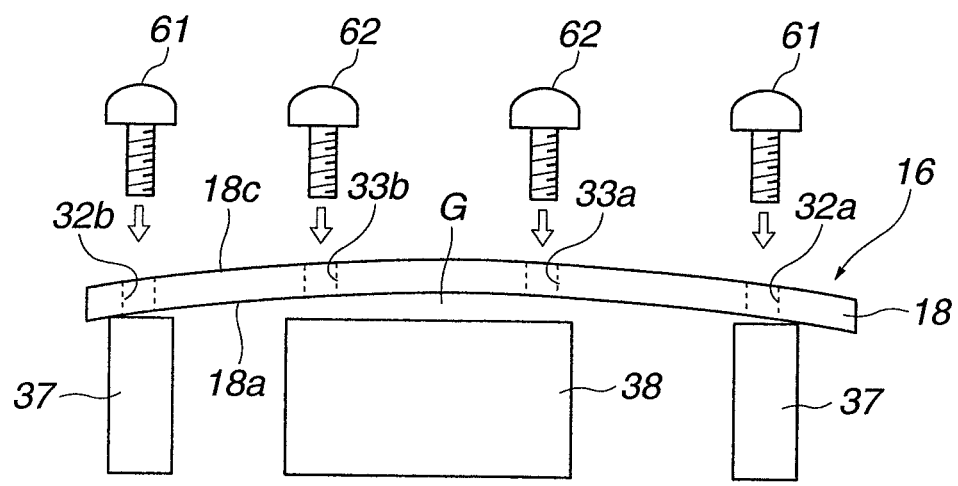

That is, as is depicted by FIG. 11A, when the molten plastic in the mold is being cooled, flat base portion 18 tends to show a warp. The reason of production of such warp may be as follows. That is, a plurality of bus bars 63 are arranged on upper surface 18c of flat base portion 18, and thus, when the molten plastic injected into the mold is cooled during its curing, the part mounting surface (or lower surface) 18a of flat base portion 18 shows a large shrinkage as compared with the upper surface 18c, which causes production of the warp that swells upward. It has been found that depending on the molding condition, the warp may swell downward.

Accordingly, when flat base portion 18 having the warp formed thereon is simply put on cylindrical columns 37 of case 12, there is inevitably produced a certain gap "G" between flat base portion 18 and raised rectangular flat portion 38 of case 12, as is seen from FIG. 11A.

Figure 11B:
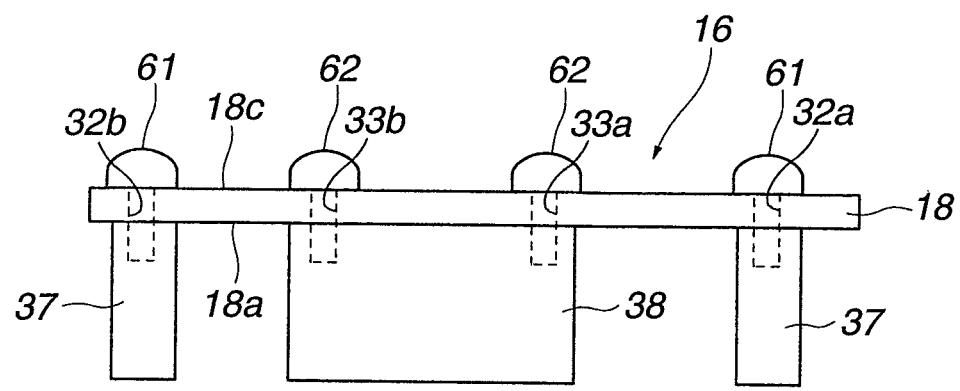

However, in the present invention, as is shown in FIG. 11B, flat base portion 18 is tightly secured to raised rectangular flat portion 38 by means the four inside connecting bolts 62 in the above-mentioned manner. With this bolting, the gap "G" appearing near raised rectangular flat portion 38 is removed. Actually, eight connecting bolts 62 and 61, that is, four inside connecting bolts 62 and four outside connecting bolts 61, are used for connecting power module 16 to case 12.

Accordingly, as will be understood from FIG. 4, six switching elements 24 mounted on the lower surface of flat base portion 18 are caused to intimately contact their major walls to the raised rectangular flat portion 38 of case 12. Accordingly, the heat transmission from switching elements 24 to the raised rectangular flat portion 38 is effectively carried out.

In the above-mentioned bolting, due to direct engagement between four inside connecting bolts 62 and four threaded openings 38a formed in the raised rectangular flat portion 38, the switching element mounting zone "A" of flat base portion 18 is directly fixed and secured to the raised rectangular flat portion 38. Thus, intimate contact between major flat surfaces of switching elements 24 and the raised rectangular flat portion 38 is assuredly achieved. When the raised rectangular flat portion 38 is constructed to have a larger flat surface, the undesired warp of flat base portion 18 can be effectively removed by the bolting.

Figure 12A:
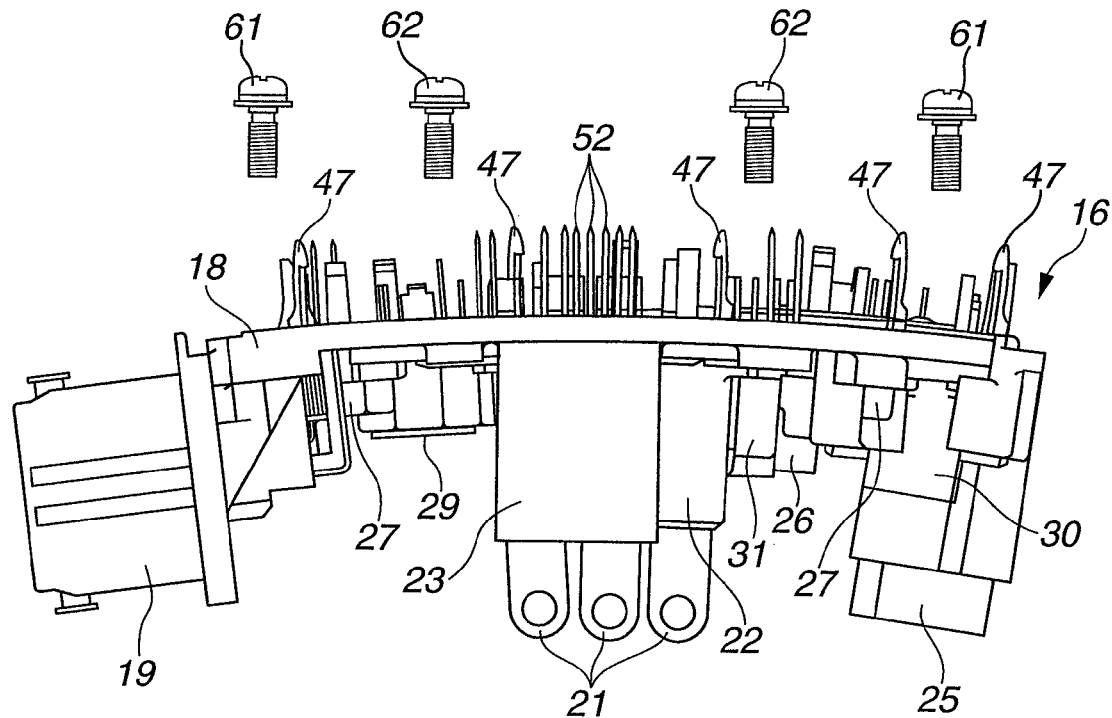
Figure 12B:
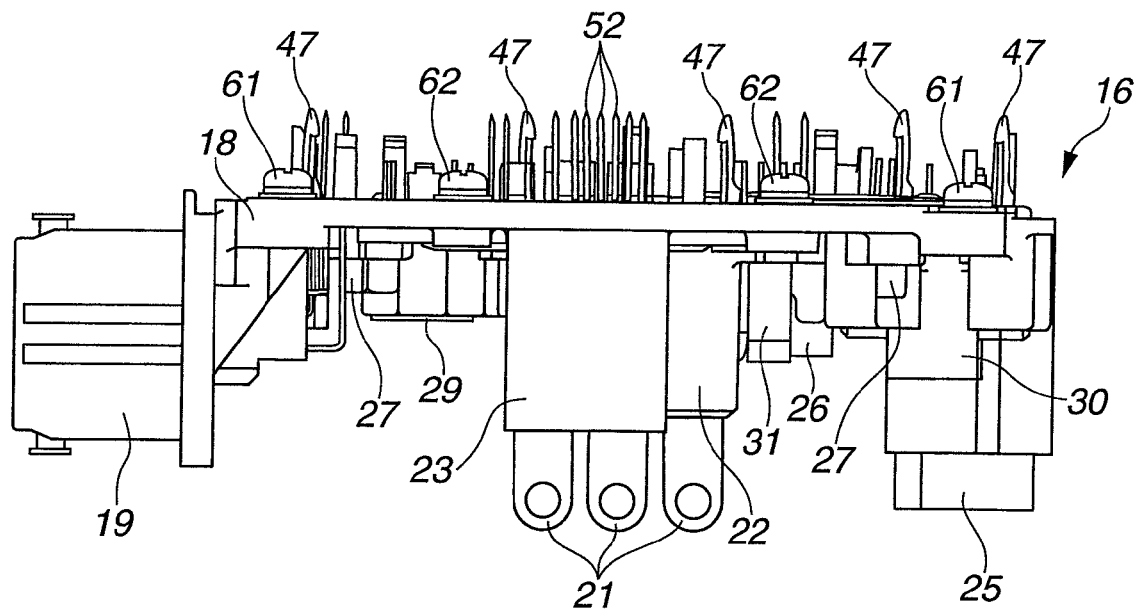

The above-mentioned advantageous matters obtained by the bolting will be more clearly understood from the following description that is directed to FIGS. 12A and 12B.

FIG. 12A is a side view of a real power module 16 in which various electronic parts are mounted to upper and lower surfaces of a flat base portion 18 that has been warped, while FIG. 12B is a side view of the real power module 16 that has been secured to case 12 (not shown) by four inside connecting bolts 62 and four outside connecting bolts 61.

It is to be noted that even if flat base portion 18 is warped in an opposite direction due to a change in molding technique, usage of the eight connecting bolts 61 and 62 can remove the warp of flat base portion 18.

Then, as will be understood from FIGS. 3, 5 and 9, control module 17 is mounted to power module 16 in the following manner.

First, control module 17 is softly placed on catch columns 49 of flat base portion 18 having connecting terminals 52 of power module 16 inserted through the through holes 53 of control module 17 and then control module 17 is moved in various horizontal directions and set to a position where all of cuts 17c of control module 17 are mated with upper guide surfaces 51b of pawls 51 of catch columns 49. Then, control module 17 is pressed downward against power module 16. With this, as has been mentioned hereinabove, pawls 51 of catch columns 49 are brought into engagement with cuts 17c of control module 17 after being resiliently flexed outward. With this engagement, control module 17 is resiliently held by snap-fit units 47. That is, as will be understood from FIG. 9, control module 17 is properly positioned above flat base portion 18 of power module 16 keeping a certain space therebetween with the aid of cylindrical support columns 48.

Then, as will be understood from FIG. 3, the upper portions of connecting terminals 52, which have been projected upward from through holes 53 of control module 17, are soldered at their root portions to their corresponding through holes 53 that are hemmed with metal rings.

Then, cover 15 is put on case 12 and then secured to the same by the four connecting bolts 34 in the above-mentioned manner. With the above-mentioned assembling steps, motor control device 3 is produced.

It is now to be noted that for properly mounting control module 17 to power module 16, pressing control module 17 toward power module 16 is only needed, which facilitates the work for assembling motor control device 3.

Figure 13A:
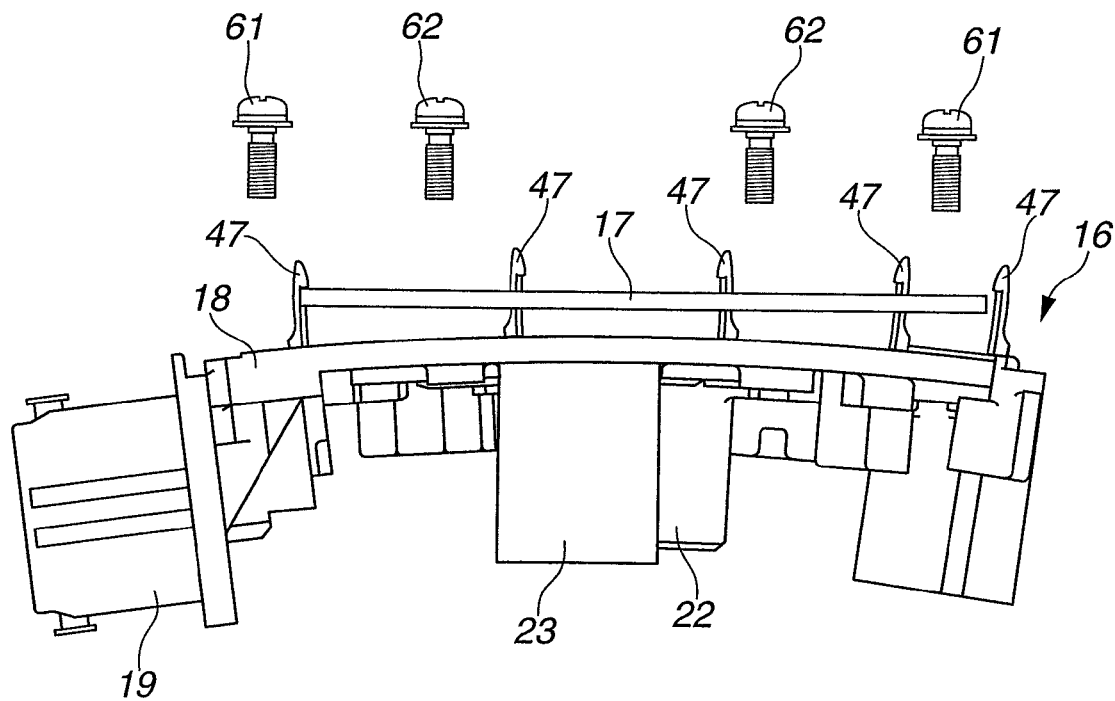
Figure 13B:
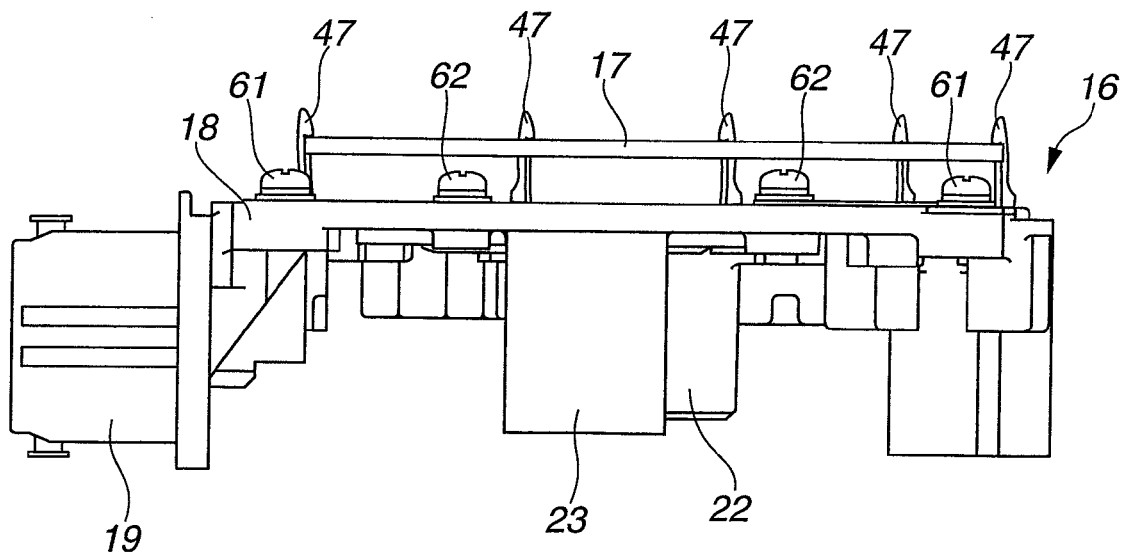

The above-mentioned advantageous matters obtained by the bolting will be much clearly understood from the following description that is directed to FIGS. 13A and 13B.

FIG. 13A is a schematically illustrated side view of a unit that includes power module 16 and control module 17 in a condition wherein power module 16 has been subjected to a warp, while FIG. 13B is side view of the unit showing a condition wherein power module 16 has been mounted to case 12 (not shown) by four inside connecting bolts 62 and four outside connecting bolts 61.

As is seen from FIG. 13A, once flat base portion 18 of power module 16 produces a warp at the time of molding, snap-fit units 47 are subjected to an angular deformation. If such warp is not removed, mounting of control module 17 to snap-fit units 47 is not made properly. Of course, in this case, proper positioning of control module 17 relative to power module 16 is not achieved. Furthermore, the warp of flat base portion 18 causes an angular deformation of connecting terminals 52 of power module 16 as will be understood from FIG. 3. In this case, the work for inserting connecting terminals 52 through the through holes 53 of control module 17 becomes very difficult or at least troublesome.

However, in the present invention, as is seen from FIG. 13B, usage of the eight connecting bolts 61 and 62 for securing power module 16 to case 12 removes such warp of flat base portion 18, and thus, the above-mentioned drawbacks depicted by FIG. 13A can be eliminated. That is, the work for assembling motor control device 3 is facilitated.

In the following, other advantages of the first embodiment of the present invention will be described with the aid of the drawings.

As is described hereinabove, control module 17 is stably supported or held by snap-fit units 47 that are integrally formed on flat base portion 18 of power module 16. Because of their inherent construction of snap-fit units 47, they can serve also as a shock absorbing means. Thus, even when a remarkable shock is applied to power module 16, electronic parts mounted on control module 17 can be protected from being damaged by such shock. If control module 17 is tightly fixed to power module 16, such shock is directly transmitted to the electronic parts of control module 17, which tends to induce a damage or breakage of the electronic parts.

For connecting power module 16 to case 12, the eight connecting bolts 61 and 62 are employed. That is, power module 16 and case 12 are combined firmly by such eight connecting bolts 61 and 62, and thus, undesired resonance of power module 16 is suppressed even if vibration is transmitted thereto from the outside.

Due to provision of snap-fit units 47 that are integral with flat base portion 18, thermal expansion of power module 16 and control module 17 caused by a heat generated by them is suitably absorbed by snap-fit units 47. That is, because of the nature of snap-fit units 47, they can serve as a deformation absorbing means. Even if power module 16 and control module 17 show a difference in heat expansion degree, flexible deformation of snap-fit units 47 can suitably absorb such heat expansion difference, and thus, power module 16 and control module 17, more specifically, the soldered portions of the modules 16 and 17, are suppressed from being attacked and damaged by an external stress.

Because of provision of snap-fit units 47 by which control module 17 is held, there is no need of providing control module 17 with connecting openings through which connecting bolts pass to be engaged with flat base portion 18. Thus, control module 17 can be reduced in size, which improves the degree of freedom in designing control module 17.

As is mentioned hereinabove, in the first embodiment of the invention, the four inside connecting holes 33a, 33b, 33c and 33d provided around the six switching elements 24 are secured to the flat top surface of raised rectangular flat portion 38 of case 12 by the four inside connecting bolts 62. Thus, the intimate contact between the major surfaces of six switching elements 24 and the flat top surface of raised rectangular flat portion 38 is assured or improved and thus, cooling of the switching elements 24 is effectively carried out. Particularly, in the first embodiment, first and second inside connecting holes 33a and 33b are provided between stator connecting male portion 20 and the group of six switching elements 24 and a limited area of flat base portion 18 where first and second inside connecting holes 33a and 33b are provided is secured to raised rectangular flat portion 38. Thus, stator connecting male portion 20 projected downward from flat base portion 18 of power module 16 can have an increased rigidity. Due to this increased rigidity, stator connecting male portion 20 is suppressed from being broken or deformed by a stress that would be produced when stator connecting male portion 20 is coupled with a stator connecting female portion (not shown) of the stator of electric motor 2.

Stator connecting male portion 20 is placed just beside raised rectangular flat portion 38 that serves as a heatsink, and thus any heat transmitted to stator connecting male portion 20 can be transmitted to raised rectangular flat portion 38 via heat radiation, which is effective in cooling stator connecting male portion 20. Due to provision of raised rectangular flat portion 38 that serves as a heatsink, the temperature in housing 7, more specifically, the temperature of power module 16 and control module 17 can be controlled to a lower level. Furthermore, since raised rectangular flat portion 38 serves also as a means for supporting stator connecting male portion 20, undesired vibration of stator connecting male portion 20, which would be caused by a vibration transmitted thereto from the outside, is suppressed.

As is seen from FIG. 7, first and second inside connecting holes 33a and 33b of flat base portion 18 of power module 16 are generally aligned in the axial direction of electric connector 19 (viz., in the direction "X" in FIG. 14), and like this, third and fourth inside connecting holes 33c and 33d are generally aligned in the same direction. Accordingly, the above-mentioned undesirable warp of flat base portion 18 can be assuredly removed when power module 16 is secured to case 12 by the four inside connecting bolts 62 that are engaged with the four threaded openings 38a of raised rectangular flat portion 38 after passing through the inside connecting holes 33a, 33b, 33c and 33d.

As is seen from FIG. 7, first and third inside connecting holes 33a and 33b are generally aligned in a direction (viz., in the direction of "Y" in FIG. 14) perpendicular to the axial direction of electric connector 19, and like this, second and fourth inside connecting holes 33b and 33d are generally aligned in the same direction. Accordingly, a warp of flat base portion 38 that appears in the direction perpendicular to the axial direction of electric connector 19 can be assuredly removed when power module 16 is bolted to case 12 in the above-mentioned manner.

As is seen from FIG. 7, the four inside connecting holes 33a, 33b, 33c and 33d are arranged to surround the six switching elements 24, any warp of the switching element mounting zone "A" of flat base portion 18 is assuredly removed when power module 16 is bolted to case 12 in the above-mentioned manner.

As is seen from FIG. 7, the six switching elements 24 and stator connecting male portion 20 are arranged between a unit including normal mode coil 30 and first electrolytic condensers 25 and electric connector 19. This arrangement causes that stator connecting male portion 20 is placed at a generally center portion of case 12, and thus, as is seen from FIG. 1, a distance between stator connecting male portion 20 and electric motor 2 can be reduced, which is effective in making actuator unit 1 compact in size. Of course, due to the reduced distance therebetween, the work for assembling actuator unit 1 is facilitated. Furthermore, due to the same reason, effective noise reduction is expected. Furthermore, a generally central portion of case 12 is secured to power module 16 by the four inside connecting bolts 62. This means that an area of flat base portion 18 where the largest deformation (or warp) tends to appear is directly bolted to case 12, which effectively removes the warp.

In the following, second to seventh embodiments of the present invention will be described with the aid of the accompanying drawings. These embodiments show various layouts of inside connecting holes 33a, 33b, 33c and 33d that are different from the layout of the above-mentioned first embodiment.

Figure 15:
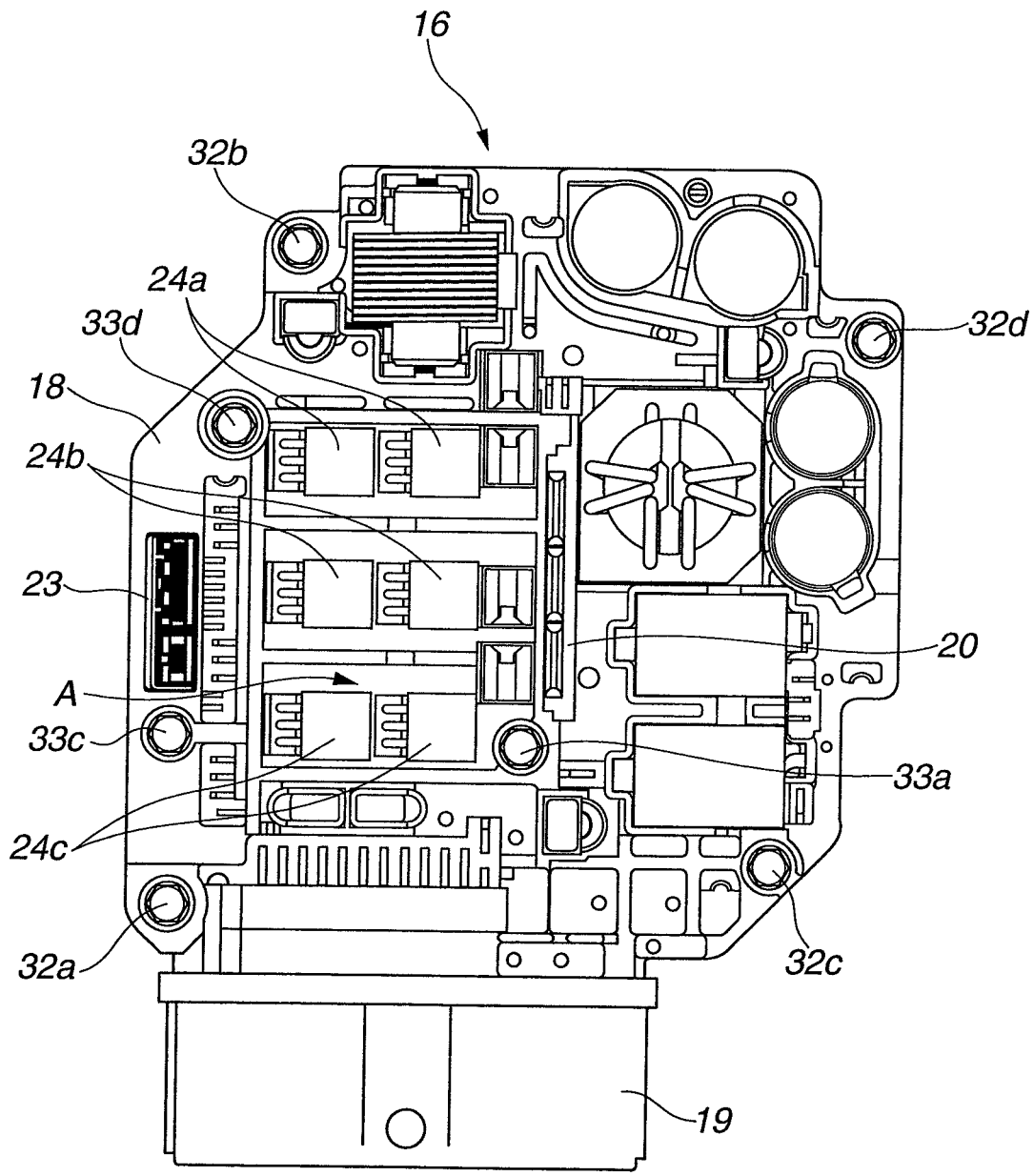
FIG. 15 is a view similar to FIG. 14, but showing a second embodiment of the present invention in which the layout of the inside mounting holes is different from that of the first embodiment.

Referring to FIG. 15, there is shown the second embodiment of the present invention.

As will become apparent when comparing FIG. 15 with FIG. 14 (first embodiment), the second embodiment is substantially the same as the above-mentioned first embodiment except that in the second embodiment, there is no connecting hole that corresponds to second inside connecting hole 33b provided in the first embodiment. That is, in this second embodiment, the switching element mounting zone "A" of flat base portion 18 of power module 16 is secured to raised rectangular flat portion 38 of case 12 by three inside connecting bolts 62 that are in association with three inside connecting holes 33a, 33c and 33d. If desired, third and fourth inside connecting holes 33c and 33d may be removed. In this case, securing power module 16 to case 12 is made by four outside connecting bolts 61 and one inside connecting bolt 62 that is in association with first connecting hole 33a.

Figure 16:
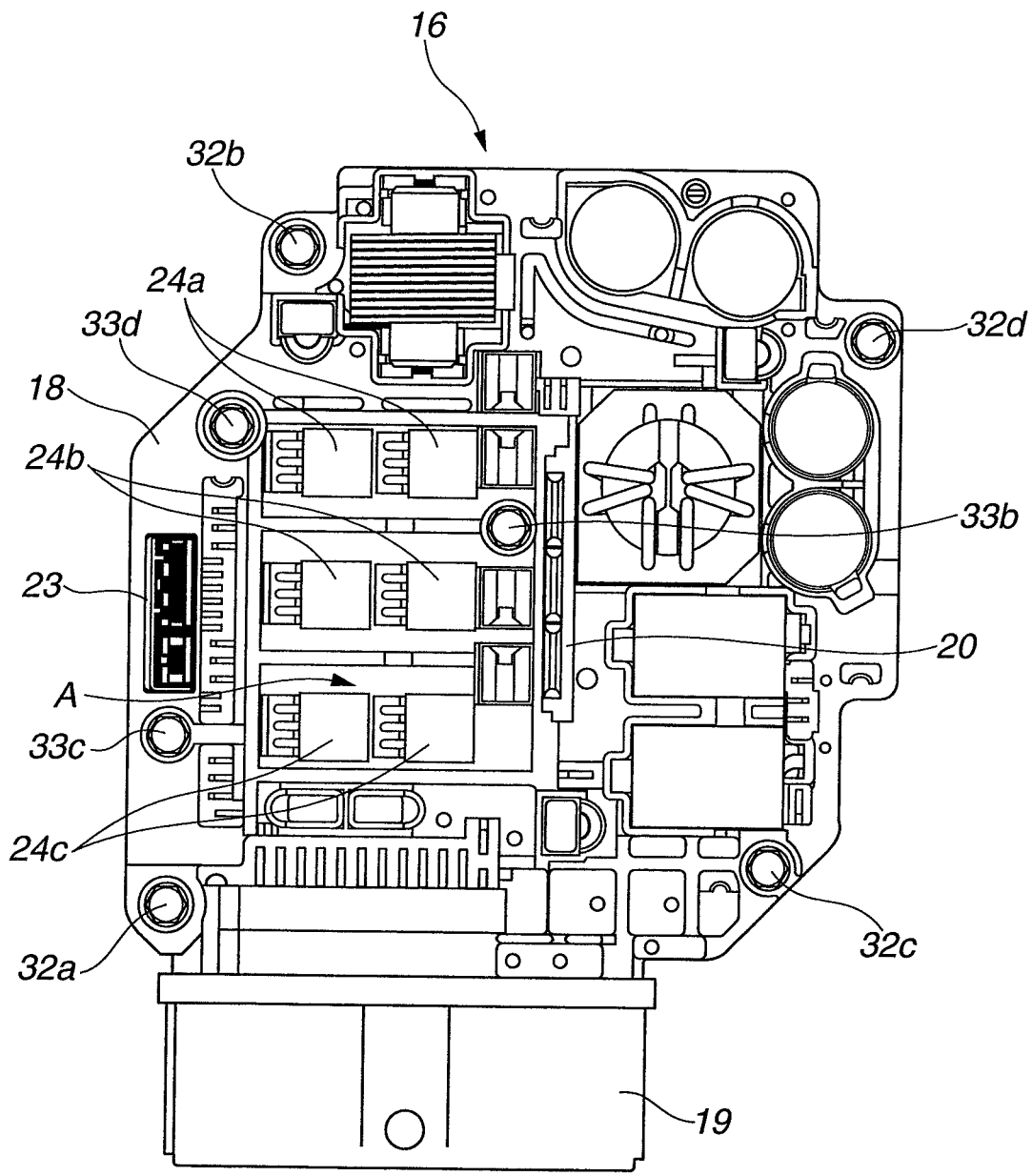
FIG. 16 is a view similar to FIG. 14, but showing a third embodiment of the present invention in which the layout of the inside mounting holes is different from those of the first and second embodiments.

Referring to FIG. 16, there is shown the third embodiment of the present invention.

As is seen from the drawing, the third embodiment is substantially the same as the first embodiment except that in the third embodiment, there is no connecting hole that corresponds to first inside connecting hole 33a provided in the first embodiment. That is, in this third embodiment, the switching element mounting zone "A" of flat base portion 18 of power module 16 is secured to raised rectangular flat portion 38 of case 12 by three inside connecting bolts 62 that are in association with the three inside connecting holes 33b, 33c and 33d. If desired, third and fourth inside connecting holes 33c and 33d may be removed. In this case, securing power module 16 to case 12 is made by four outside connecting bolts 61 and one inside connecting bolt 62 that is in association with second connecting hole 33b.

Figure 17:
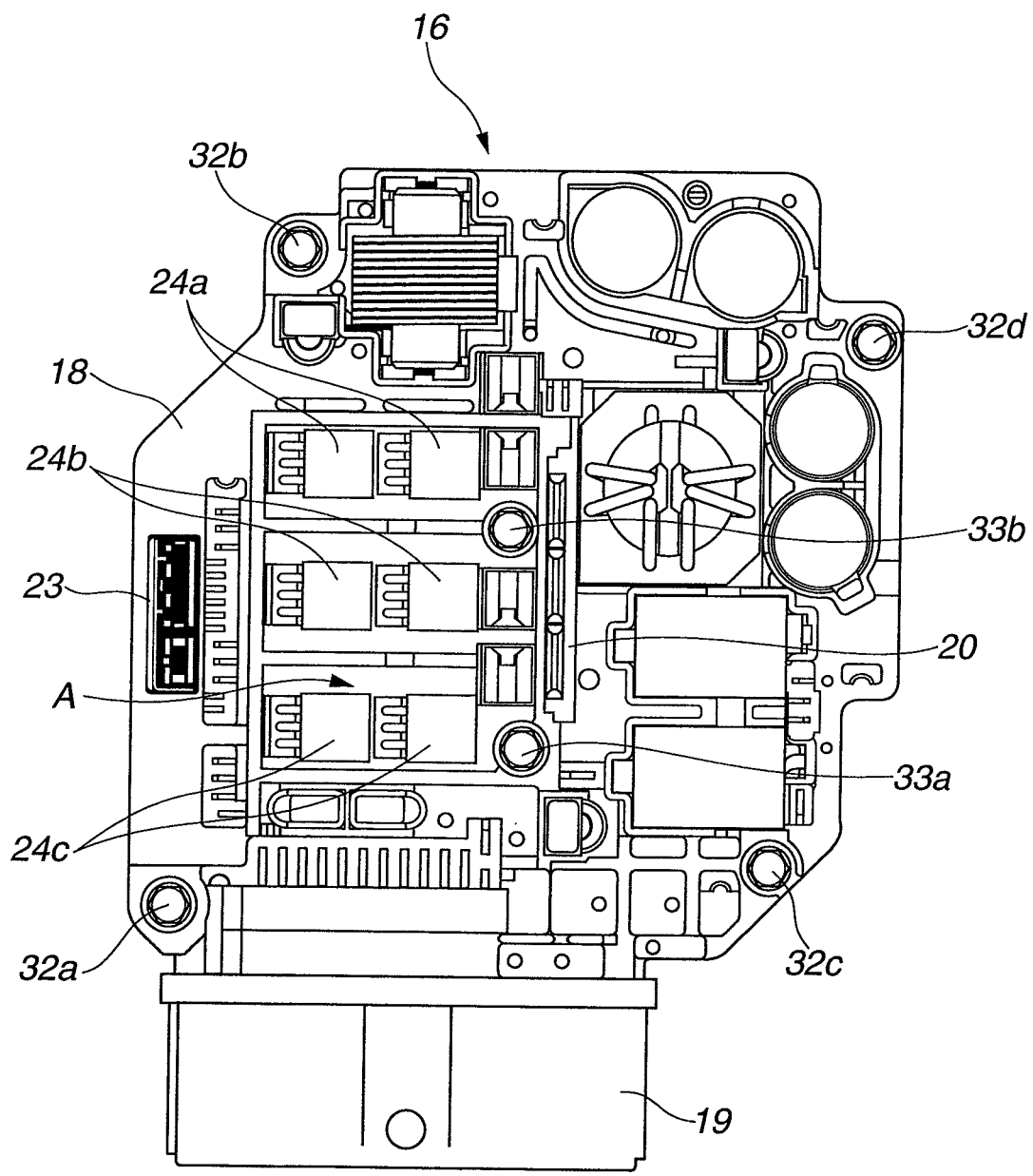
FIG. 17 is a view similar to FIG. 14, but showing a fourth embodiment of the present invention in which the layout of the inside mounting holes is different from those of the first, second and third embodiments.

Referring to FIG. 17, there is shown the fourth embodiment of the present invention.

As is seen from the drawing, the fourth embodiment is substantially the same as the first embodiment except that in the fourth embodiment, there are no connecting holes that correspond to third and fourth inside connecting holes 33c and 33d provided in the first embodiment. That is, in this fourth embodiment, the switching element mounting zone "A" of flat base portion 18 is secured to raised rectangular flat portion 38 by two inside connecting bolts 62 that are in association with the two inside connecting holes 33a and 33b. In other words, securing power module 16 to case 12 is made by four outside connecting bolts 61 and two inside connecting bolts 62 that are in association with the two inside connecting holes 33a and 33b.

Figure 18:
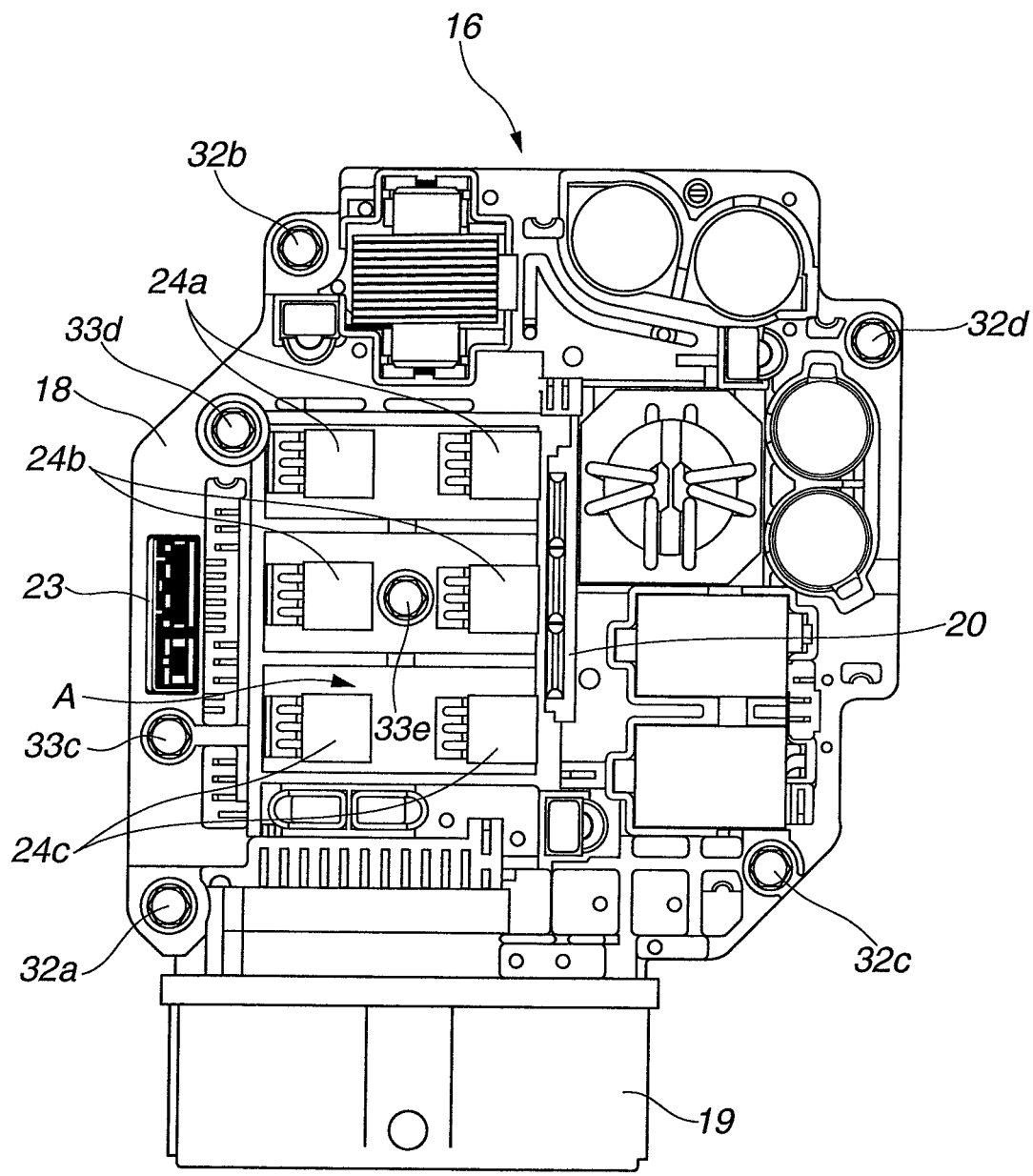
FIG. 18 is a view similar to FIG. 14, but showing a fifth embodiment of the present invention in which the layout of the inside mounting holes is different from those of the first, second, third and fourth embodiments.

Referring to FIG. 18, there is shown the fifth embodiment of the present invention.

As is seen from the drawing, the fifth embodiment is substantially the same as the first embodiment except that in the fifth embodiment, one connecting hole 33e is provided in a center of the switching element mounting zone "A" in place of first and second connecting holes 33a and 33b provided in the first embodiment. Thus, in this fifth embodiment, the switching element mounting zone "A" of flat base portion 18 is secured to raised rectangular flat portion 38 by three inside connecting bolts 62 that are in association with the three inside connecting holes 33c, 33d and 33e. In other words, securing power module 16 to case 12 is made by four outside connecting bolts 61 and three inside connecting bolts 62 that are in association with three inside connecting holes 33c, 33d and 33e.

Referring to FIG. 19, there is shown the sixth embodiment of the present invention.

As is seen from the drawing, the sixth embodiment is substantially the same as the first embodiment except that in the sixth embodiment, two inside connecting holes 33f and 33g are provided in a center area of the switching element mounting zone "A" in place of first and second connecting holes 33a and 33b provided in the first embodiment. Inside connecting hole 33f is placed between the lower pair of switching elements 24 and the middle pair of switching elements 24, and the other inside connecting hole 33g is placed between the middle pair of switching elements 24 and the upper pair of switching elements 24. Thus, in this sixth embodiment, the switching element mounting zone "A" of flat base portion 18 is secured to raised rectangular flat portion 38 by four inside connecting bolts 62 that are in association with the four inside connecting holes 33c, 33d, 33f and 33g. In other words, securing power module 16 to case 12 is made by four outside connecting bolts 61 and four inside connecting bolts 62 that are in association with the four inside connecting holes 33c, 33d, 33f and 33g.

Referring to FIG. 20, there is shown the seventh embodiment of the present invention.

As is seen from the drawing, the seventh embodiment is substantially the same as the first embodiment except that in the seventh embodiment, three inside connecting holes 33h, 33i and 33j are provided in a laterally middle area of the switching element mounting zone "A" in place of first and second inside connecting holes 33a and 33b provided in the first embodiment. Each inside connecting hole 33h, 33i or 33j is placed between paired switching elements 24 as shown. Thus, in this seventh embodiment, the switching element mounting zone "A" of flat base portion 18 is secured to raised rectangular flat portion 38 by five inside connecting bolts 62 that are in association with the five inside connecting holes 33c, 33d, 33h, 33i and 33j. In other words, securing power module 16 to case 12 is made by four outside connecting bolts 61 and five inside connecting bolts 62 that are in association with the five inside connecting holes 33c, 33d, 33h, 33i and 33j.

The entire contents of Japanese Patent Application 2011-194588 filed Sep. 7, 2011 and Japanese Patent Application 2012-156599 filed Jul. 12, 2012 are incorporated herein by reference.

Although the invention has been described above with reference to embodiments of the invention, the invention is not limited to such embodiments as described above. Various modifications and variations of such embodiments may be carried out by those skilled in the art, in light of the above description.

What is claimed is:

1. An electronic control device comprising:
   a circuit board having a heat generating part mounted thereon;
   a case for installing therein the circuit board, the case having a heat receiving portion that is in contact with the heat generating part;
   at least two first fixing units that are constructed and arranged to fix a peripheral portion of the circuit board to the case;
   at least one second fixing unit that is arranged to fix a given area of the circuit board to the case while pressing the given area against the heat receiving portion through the heat generating part, the given area being an area where the heat generating part is placed; and
   in which the circuit board is provided with an electric plug unit that projects toward the bottom wall of the case and in which the second fixing unit is arranged between the electric plug unit and the heat generating part.

2. An electronic control device as claimed in claim 1, in which the electric plug unit is arranged beside a side wall of the projected flat portion of the case.

3. An electronic control device as claimed in claim 1, in which the electric plug unit includes terminals through which a drive current is fed to an electric actuator to which the case is connected.

4. An electronic control device comprising:
a circuit board having a heat generating part mounted thereon;
a case for installing therein the circuit board, the case having a heat receiving portion that is in contact with the heat generating part;
at least two first fixing units that are constructed and arranged to fix a peripheral portion of the circuit board to the case;
at least one second fixing unit that is arranged to fix a given area of the circuit board to the case while pressing the given area against the heat receiving portion through the heat generating part, the given area being an area where the heat generating part is placed; and
in which the circuit board is equipped with a tubular electric connector through which an electric power is fed to electric elements mounted on the circuit board, and in which a plurality of second fixing units are arranged along an axial direction of the tubular electric connector.

5. An electronic control device comprising:
a circuit board having a heat generating part mounted thereon;
a case for installing therein the circuit board, the case having a heat receiving portion that is in contact with the heat generating part;
at least two first fixing units that are constructed and arranged to fix a peripheral portion of the circuit board to the case;
at least one second fixing unit that is arranged to fix a given area to the circuit board to the case while pressing the given area against the heat receiving portion through the heat generating part, the given area being an area where the heat generating part is placed; and
in which the circuit board is provided with a tubular electric connector, and in which a plurality of second fixing units are aligned in a direction perpendicular to an axial direction of the tubular electric connector.

6. An electronic control device comprising:
a circuit board having a heat generating part mounted thereon;
a case for installing therein the circuit board, the case having a heat receiving portion that is in contact with the heat generating part;
at least two first fixing units that are constructed and arranged to fix a peripheral portion of the circuit board to the case;
at least one second fixing unit that is arranged to fix a given area of the circuit board to the case while pressing the given area against the heat receiving portion through the heat generating part, the given area being an area where the heat generating part is placed; and
in which the heat generating part comprises three pairs of heat generating elements that are arranged adjacent to one another and in which at least two second fixing units are arranged on an imaginary line that extends along a line passing through the two heat generating elements that constitute one pair.

7. An electronic control device comprising:
a circuit board having a heat generating part mounted thereon;
a case for installing therein the circuit board the case having a heat receiving portion that is in Contact with the heat generating part;
at least two first fixing units that are constructed and arranged to fix a peripheral portion of the circuit board to the case;
at least one second fixing unit that is arranged to fix a given area of the circuit board to the case while pressing the given area against the heat receiving portion through the heat generating part, the given area being an area where the heat generating part is placed; and
in which the circuit board is equipped with a tubular electric connector, a noise filtering circuit and an electric plug unit that projects toward the bottom wall of the case for feeding an electric actuator with a drive current, and in which the heat generating part and the electric plug unit are placed between the tubular electric connector and at least one part of the noise filtering circuit.

8. An electronic control device comprising:
a circuit board having a heat generating part mounted thereon;
a case for installing therein the circuit board, the case having a heat receiving portion that is in contact with the heat generating part;
at least two first fixing units that are constructed and arranged to fix a peripheral portion of the circuit board to the case;
at least one second fixing unit that is arranged to fix a given area of the circuit board to the case while pressing the given area against the heat receiving portion through the heat generating part, the given area being an area where the heat generating part is placed; and
in which the circuit board is equipped with a tubular electric connector and a noise filtering circuit, and in which the at least one second fixing unit is placed between the tubular electric connector and at least one part of the noise filtering circuit.

9. An electronic control device comprising:
a circuit board having a heat generating part mounted thereon;
a case for installing therein the circuit board, the case having a heat receiving portion that is in contact with the heat generating part;
at least two first fixing units that are constructed and arranged to fix a peripheral portion of the circuit board to the case;
at least one second fixing unit that is arranged to fix a given area of the circuit board to the case while pressing the given area against the heat receiving portion through the heat generating part, the given area being an area where the heat generating part is placed; and
a second circuit board that is mounted over the circuit board; and
a plurality of resiliently deformable holding poles that are provided on the circuit board and projected toward the second circuit board, each pole having a pawl that is able to catch a peripheral portion of the second circuit board.

10. An electronic control device comprising:
a first circuit board having a heat generating part mounted thereon;
a second circuit board mounted over the first circuit board through a plurality of snap-fit units formed on the second first circuit board;

a case for installing therein the first and second circuit boards, the case having a raised portion of which flat top surface faces a major surface of the heat generating part of the first circuit board; and inside connecting bolts that secure the first circuit board to the case in such a manner that the major surface of the heat generating part intimately contact to the flat top surface of the raised portion, each inside connecting bolt being engaged with a threaded opening formed at the flat top surface of the raised portion of the case after passing through an inside connecting hole formed in the first circuit board; and outside connecting bolts that secure the first circuit board to the case, each outside connecting bolt being engaged with a threaded opening formed at a peripheral portion of the case after passing through an outside connecting hole formed in the first circuit board.

11. An electronic control device as claimed in claim 10, in which the inside connecting bolts are arranged to surround the heat generating part of the first circuit board.

12. An electronic control device as claimed in claim 11, in which the heat generating part is a group of switching elements mounted to a circuit board printed on a lower surface of the first circuit board.

13. An electronic control device as claimed in claim 12, in which the flat top surface of the raised portion of the case is rectangular in shape.

* * * * *